United States Patent
Lee et al.

(10) Patent No.: US 10,405,438 B2
(45) Date of Patent: Sep. 3, 2019

(54) DISPLAY DEVICE

(71) Applicant: SAMSUNG DISPLAY CO., LTD., Yongin-si, Gyeonggi-do (KR)

(72) Inventors: Keunsoo Lee, Cheonan-si (KR); Kyungchan Chae, Hwaseong-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 141 days.

(21) Appl. No.: 15/697,798

(22) Filed: Sep. 7, 2017

(65) Prior Publication Data

US 2018/0070461 A1   Mar. 8, 2018

(30) Foreign Application Priority Data

Sep. 8, 2016   (KR) .......................... 10-2016-0115635

(51) Int. Cl.
| | |
|---|---|
| *H05K 5/00* | (2006.01) |
| *H01L 27/32* | (2006.01) |
| *G09G 3/3225* | (2016.01) |

(52) U.S. Cl.
CPC ......... *H05K 5/0017* (2013.01); *G09G 3/3225* (2013.01); *H01L 27/3295* (2013.01); *G02F 2201/503* (2013.01); *G09G 2300/0426* (2013.01); *G09G 2330/04* (2013.01); *G09G 2380/02* (2013.01)

(58) Field of Classification Search
None
See application file for complete search history.

(56) References Cited

U.S. PATENT DOCUMENTS

| | | | |
|---|---|---|---|
| 7,326,598 B2 | 2/2008 | Kim | |
| 9,490,215 B2 | 11/2016 | Yang | |
| 2005/0231108 A1* | 10/2005 | Furukawa | G02F 1/133305 313/506 |
| 2006/0210708 A1 | 9/2006 | Rho | |
| 2007/0090420 A1* | 4/2007 | Chu | G02F 1/136286 257/291 |
| 2013/0050157 A1* | 2/2013 | Baek | G09G 3/2022 345/204 |
| 2014/0028534 A1* | 1/2014 | Park | G09G 3/34 345/84 |
| 2014/0091288 A1* | 4/2014 | Lee | H01L 51/5256 257/40 |
| 2014/0098005 A1* | 4/2014 | Kim | G06F 3/1446 345/1.3 |
| 2014/0232956 A1* | 8/2014 | Kwon | G02F 1/133305 349/12 |

FOREIGN PATENT DOCUMENTS

| | | |
|---|---|---|
| KR | 10-2004-0003936 A | 1/2004 |
| KR | 10-0519948 B1 | 9/2005 |
| KR | 10-2015-0059048 A | 5/2015 |

* cited by examiner

*Primary Examiner* — Fernando Alcon
(74) *Attorney, Agent, or Firm* — Lee & Morse, P.C.

(57) ABSTRACT

A display device includes a substrate having a display area and a non-display area surrounding the display area, a driving unit connected to the substrate, at least one first crack prevention pattern at the non-display area, the at least one first crack prevention pattern including facing end portions, and an alignment key at the non-display area, at least a portion of the alignment key being between the facing end portions of the at least one first crack prevention pattern.

20 Claims, 23 Drawing Sheets

DISPLAY DEVICE

CROSS-REFERENCE TO RELATED APPLICATION

Korean Patent Application No. 10-2016-0115635, filed on Sep. 8, 2016, in the Korean Intellectual Property Office, and entitled: "Display Device," is incorporated by reference herein in its entirety.

1. Field

Exemplary embodiments relate to a display device, and more particularly, to a display device with a reduced size of a non-display area.

2. Description of the Related Art

In recent times, a flexible display device, which is manufactured so that an image can be displayed even when a portion of the substrate is bent like paper by forming a display area, a wiring, and the like on a flexible substrate, is garnering attention as a next generation display device. Flexible display devices are applied not only to monitors of computers and televisions but also to personal portable devices.

For example, an organic light emitting diode ("OLED") display device is a self-luminous display device in which a separate light source unit is not required, which is different from a liquid crystal display ("LCD") device. Accordingly, a flexible display device which is easy to be bent may be implemented by using a flexible substrate for the OLED device to have a device with a relatively thin thickness.

SUMMARY

According to an exemplary embodiment, a display device includes a substrate having a display area and a non-display area surrounding the display area; a driving unit connected to the substrate; at least one first crack prevention pattern at the non-display area, the at least one first crack prevention pattern including facing end portions; and an alignment key at the non-display area. At least a portion of the alignment key is disposed between the facing end portions of the at least one first crack prevention pattern.

The display device may further include at least one second crack prevention pattern at the non-display area, the at least one second crack prevention pattern disposed further away from the display area than the at least one first crack prevention pattern is from the display area.

The alignment key may be between the at least one second crack prevention pattern and the display area.

The second crack prevention pattern may enclose sides of the display area except a side facing the driving unit.

The second crack prevention pattern may enclose the display area.

The display device may further include at least one third crack prevention pattern at the non-display area, the at least one third crack prevention pattern disposed more adjacent to the display area than the at least one first crack prevention pattern is to the display area.

The alignment key may be between the at least one second crack prevention pattern and the at least one third crack prevention pattern.

Two adjacent ones of a plurality of crack prevention patterns including the at least one first crack prevention pattern, the at least one second crack prevention pattern, and the at least one third crack prevention pattern may have a gradually increasing distance or a gradually decreasing distance therebetween, as more adjacent to the display area.

A plurality of crack prevention patterns including the at least one first crack prevention pattern, the at least one second crack prevention pattern, and the at least one third crack prevention pattern may have a gradually decreasing thickness or a gradually increasing thickness, as more adjacent to the display area.

The alignment key may include a plurality of alignment patterns, and at least one alignment pattern may be between the facing end portions of the at least one first crack prevention pattern.

A distance between adjacent ones of the alignment patterns may be substantially the same as or different from a distance between adjacent ones of the first crack prevention patterns.

Two adjacent ones of the alignment patterns may have a gradually increasing distance or a gradually decreasing distance therebetween, as more adjacent to the display area.

The plurality of alignment patterns may have a gradually increasing thickness or a gradually decreasing thickness, as more adjacent to the display area.

The first crack prevention pattern may include a substantially same material or a different material from a material forming the alignment key.

At least one of the first crack prevention pattern and the alignment key may include a metal material or an inorganic material.

According to another exemplary embodiment, a display device includes a substrate having a display area and a non-display area surrounding the display area; a driving unit connected to the substrate; at least one first crack prevention pattern at the non-display area; at least one second crack prevention pattern at the non-display area, the at least one second crack prevention pattern disposed further away from the display area than the at least one first crack prevention pattern is from the display area; and at least one third crack prevention pattern at the non-display area, the at least one third crack prevention pattern disposed more adjacent to the display area than the at least one first crack prevention pattern is to the display area. The at least one first crack prevention pattern includes facing end portions and the facing end portions are between the second crack prevention pattern and the third crack prevention pattern.

The display device may further include an alignment key between the at least one second crack prevention pattern and the at least one third crack prevention pattern.

At least a portion of the alignment key may be between facing end portions of at least one of the at least one first crack prevention pattern.

The alignment key may not be disposed between facing end portions of at least another of the at least one first crack prevention pattern.

A distance between facing end portions of at least one of the at least one first crack prevention pattern may be substantially the same as or different from a distance between facing end portions of at least another of the at least one first crack prevention pattern.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
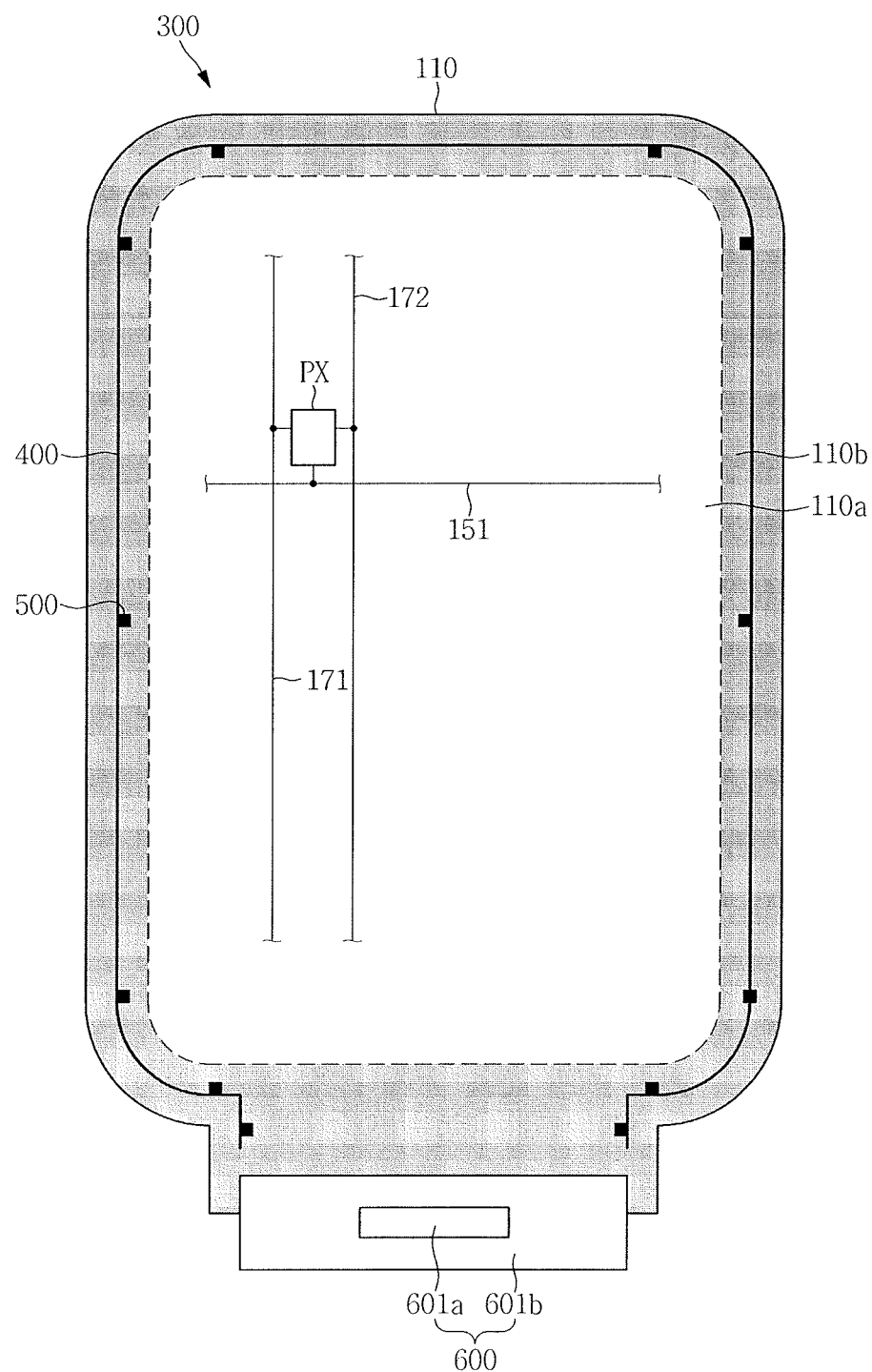
FIG. 1 illustrates a plan view of a display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

The spatially relative terms "below", "beneath", "less", "above", "upper", and the like, may be used herein for ease of description to describe the relations among one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device disposed "below" or "beneath" another device may be disposed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed thereamong. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have a same meaning as commonly understood by those skilled in the art. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Hereinafter, a display device according to embodiments will be described in detail with reference to FIGS. 1 to 25.

Figure 2:
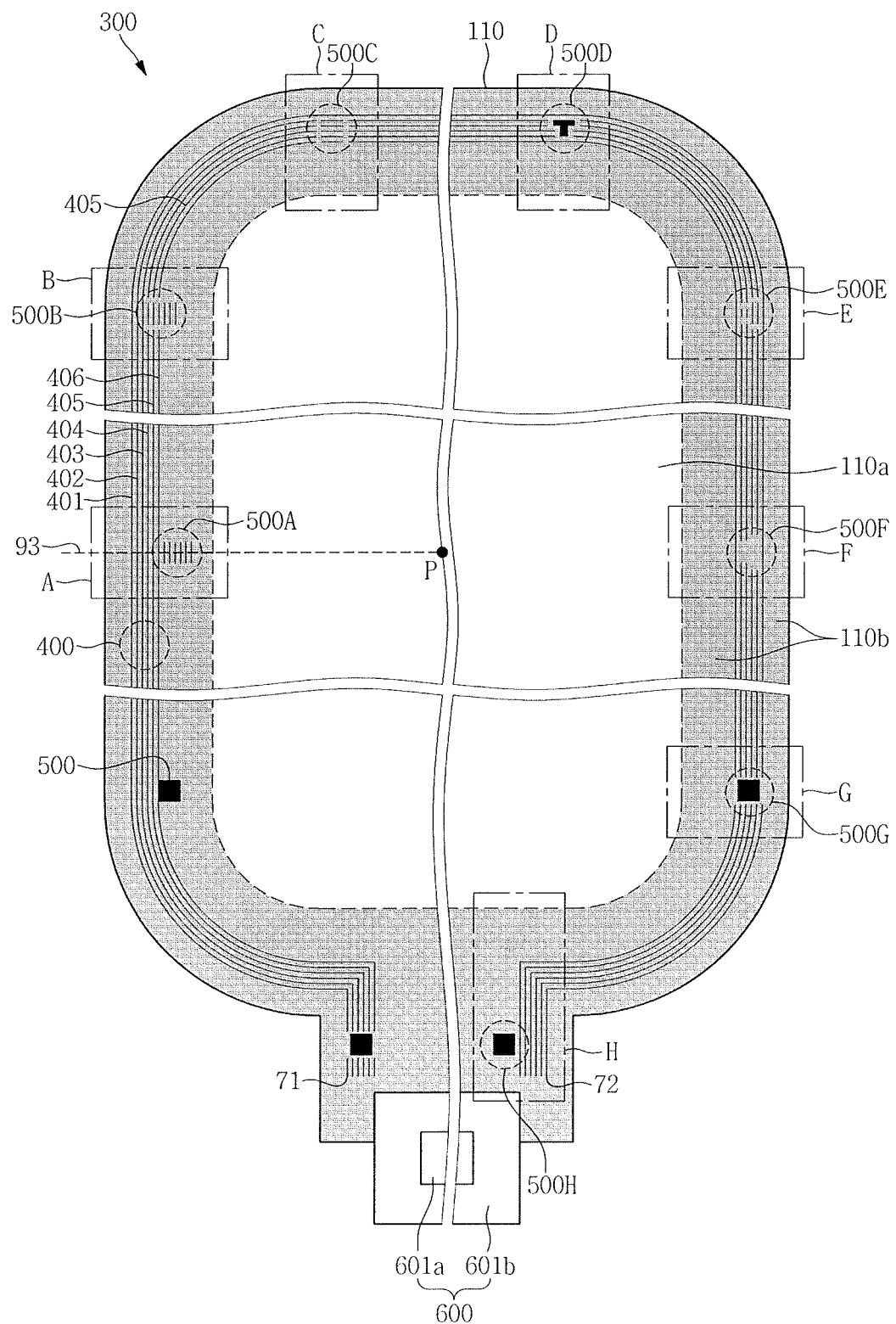
FIG. 2 illustrates a detailed configuration view of a crack prevention portion and an alignment key of FIG. 1.

FIG. 1 is a plan view illustrating a display device 300 according to an exemplary embodiment, and FIG. 2 is a detailed configuration view illustrating a crack prevention portion and an alignment key of FIG. 1.

Referring to FIGS. 1-2, the display device 300 according to an exemplary embodiment may be a flexible display device that may be bent or curved. The display device 300 may include a substrate 110, a driving unit 600, a crack prevention portion 400, and an alignment key 500.

The substrate 110 includes a display area 110a and a non-display area 110b. The non-display area 110b surrounds the display area 110a, e.g., the non-display area 110b may completely surround a perimeter of the display area 110a.

For example, the substrate 110 may have a quadrangular shape. In such an exemplary embodiment, a corner of the substrate 110 may have a round shape. For example, the display area 110a of the substrate 110 may have a quadrangular shape. In such an exemplary embodiment, a corner of the display area 110a may have a round shape. The non-display area 110b of the substrate 110 may have a ring shape enclosing the aforementioned display area 110a.

A plurality of gate lines 151, a plurality of data lines 171, and a plurality of pixels PX are disposed at the display area 110a of the substrate 110. The pixel PX is connected to the gate line 151, the data line 171, and a common power line 172. The gate lines 151, the data lines 171, and the common power lines 172 extend to the non-display area 110b and are connected to the driving unit 600.

The driving unit 600 is disposed at the non-display area 110b of the substrate 110. The driving unit 600 applies gate signals to the gate lines 151, image data signals to the data lines 171, and a common power to the common power lines 172.

The driving unit 600 may include a film 601b and a driving integrated circuit ("IC") 601a mounted on the film 601b. The driving IC 601a is connected to the gate lines 151 and the data lines 171 through transmission lines of the film 601b.

The crack prevention portion 400 is disposed at the non-display area 110b of the substrate 110. In an exemplary embodiment, the crack prevention portion 400 is disposed between the display area 110a of the substrate 100 and an edge, e.g., an outermost edge, of the substrate 110. For example, when a boundary between the display area 110a and the non-display area 110b is present (dashed line in FIG. 1), the crack prevention portion 400 may be disposed between the boundary and an edge of the substrate 110.

During a cutting process of the substrate 110 or a polishing process of the substrate 110, an impact is applied to the substrate 110, which may cause a crack in the substrate 110. The crack prevention portion 400 prevents propagation of a potential crack to the inside of the substrate 100, e.g., the crack prevention portion 400 may prevent propagation of the crack into the display area 110a.

The crack prevention portion 400 encloses a great portion of the display area 110a. For example, when one side of the display area 110a facing the driving unit 600 is defined as a first side, the crack prevention portion 400 may have a shape enclosing all sides of the display area 110a other than the first side. The crack prevention portion 400 and the driving unit 600 enclose, e.g., define a structure completely surrounding a perimeter of, the display area 110a.

As illustrated in FIG. 2, the crack prevention portion 400 may include a plurality of crack prevention patterns, e.g., first through sixth crack prevention patterns 401, 402, 403, 404, 405 and 406. It is noted, however, that while six crack prevention patterns 401, 402, 403, 404, 405 and 406 are illustrated in FIG. 2 by way of example, the number of crack prevention patterns is not limited thereto. For example, the crack prevention portion 400 may include less than six crack prevention patterns or more than six crack prevention patterns. For example, as illustrated in FIG. 2, the plurality of crack prevention patterns may be arranged to be concentric with each other around a center of the display area 110a.

Each of the crack prevention patterns 401, 402, 403, 404, 405 and 406 is spaced apart from the display area 110a at different distances, respectively. For example, as illustrated in FIG. 2, among the plurality of the crack prevention patterns 401, 402, 403, 404, 405 and 406, a first crack prevention pattern 401 is disposed farthest from the display area 110a, and a sixth crack prevention pattern 406 is disposed most adjacent to the display area 110a. A second crack prevention pattern 402 is disposed more adjacent to the display area 110a than the first crack prevention pattern 401 is thereto, a third crack prevention pattern 403 is disposed more adjacent to the display area 110a than the second crack prevention pattern 402 is thereto, a fourth crack prevention pattern 404 is disposed more adjacent to the display area 110a than the third crack prevention pattern 403 is thereto, a fifth crack prevention pattern 405 is disposed more adjacent to the display area 110a than the fourth crack prevention pattern 404 is thereto, and a sixth crack prevention pattern 406 is disposed more adjacent to the display area 110a than the fifth crack prevention pattern 405 is thereto.

As a more detailed example, as illustrated in FIG. 2, when assuming an imaginary line 93 extending from a central point P of the display area 110a and intersecting the first, second, third, fourth, fifth and sixth crack prevention patterns 401, 402, 403, 404, 405 and 406, a line segment (hereinafter "first line segment") of the imaginary line 93 connecting the central point P and the first crack prevention pattern 401 is the longest, and a line segment (hereinafter "sixth line segment") connecting the central point P and the sixth crack prevention pattern 406 is the shortest. Accordingly, among the plurality of crack prevention patterns 401, 402, 403, 404, 405 and 406, the first crack prevention pattern 401 is disposed farthest from the display area 110a and the sixth crack prevention pattern 406 is disposed most adjacent to the display area 110a. In other words, the first crack prevention pattern 401 is disposed most adjacent to an edge of the substrate 110, and the sixth crack prevention pattern 406 is disposed farthest from an edge of the substrate 110.

In an exemplary embodiment, a length of a line segment (hereinafter "second line segment") connecting the central point P of the imaginary line 93 and the second crack prevention pattern 402 is shorter than the length of the first line segment described above, a length of a line segment (hereinafter "third line segment") connecting the central point P of the imaginary line 93 and the third crack prevention pattern 403 is shorter than the length of the second line segment described above, a length of a line segment (hereinafter "fourth line segment") connecting the central point P of the imaginary line 93 and the fourth crack prevention pattern 404 is shorter than the length of the third line segment described above, a length of a line segment (hereinafter "fifth line segment") connecting the central point P of the imaginary line 93 and the fifth crack prevention pattern 405 is shorter than the length of the fourth line segment described above, and the length of the sixth line segment is shorter than the length of the fifth line segment.

Each of the crack prevention patterns 401, 402, 403, 404, 405 and 406 may have different lengths. For example, a crack prevention pattern may have a longer length, e.g., around the display area 110a, as its distance from the display area 110a increases. For example, the first crack prevention pattern 401 disposed farthest from the display area 110a may have a longest length, and the sixth crack prevention pattern 406 disposed most adjacent to the display area 110a may have a shortest length.

At least one of the plurality of crack prevention patterns 401, 402, 403, 404, 405 and 406 has a shape enclosing sides of the display area 110a except the first side, i.e., an opposite side, described above. For example, an outermost crack prevention pattern (i.e., the first crack prevention pattern 401) disposed most adjacent to an edge of the substrate 110 among the plurality of crack prevention patterns may have a shape enclosing sides of the display area 110a except the first side described above. That is, since a great part of external impact is applied to an edge of the substrate 110, it is desirable that the outermost crack prevention pattern (i.e., the first crack prevention pattern 401) most adjacent to the edge have a shape that continuously encloses all sides of the display area 110a except the opposing side.

In an exemplary embodiment, although not illustrated, the first crack prevention pattern 401 at an outermost portion may enclose the display area 110a, including the first side facing the driving unit 600, in a closed loop shape.

As illustrated in FIG. 1, the alignment key 500 is disposed at the non-display area 110b. The alignment key 500 is used to align various components when manufacturing the display device.

For example, the alignment key 500 may be disposed at the non-display area 110b between the crack prevention portion 400 and the display area 110a. For example, as illustrated in FIG. 2, the alignment key 500 may be disposed between the first crack prevention pattern 401 and the display area 110a. Other crack prevention patterns, except the first crack prevention pattern 401 at an outermost portion of the substrate 110, may have a discontinuous line (or curved line) shape, a portion of which is disconnected. At least one of said other crack prevention patterns may have a continuous line (or curve line) shape.

In detail, as illustrated in FIG. 2, the first crack prevention pattern 401 has a continuous line shape, e.g., in its entirety. That is, the first crack prevention pattern 401 includes two end portions 71 and 72 at opposite ends thereof and has a continuous line shape extending continuously from one end portion 71 to another end portion 72 around the display area 110a. Crack prevention patterns other than the first crack prevention pattern 401 may or may not have continuous line shapes in their entirety, i.e., crack prevention patterns other than the first crack prevention pattern 401 may include discontinuous portions spaced apart from each other.

As further illustrated in FIG. 2, regardless of whether the second, third, fourth, fifth and sixth crack prevention patterns 402, 403, 404, 405, and 406 have a continuous line shape or a discontinuous line shape, the alignment key 500 is disposed between the display area 110a and the first crack prevention pattern 401, e.g., the alignment key 500 does not intersect the first crack prevention pattern 401. This is because, as described above, the first crack prevention pattern 401 always has a continuous line shape. In an alternative exemplary embodiment, however, the first crack prevention pattern 401 may have a discontinuous line shape. In an exemplary embodiment, the alignment key 500 may be disposed at the non-display area 110b between the driving unit 600 and the display area 110a FIG. 3 is an enlarged view illustrating portion A of FIG. 2.

Figure 3:
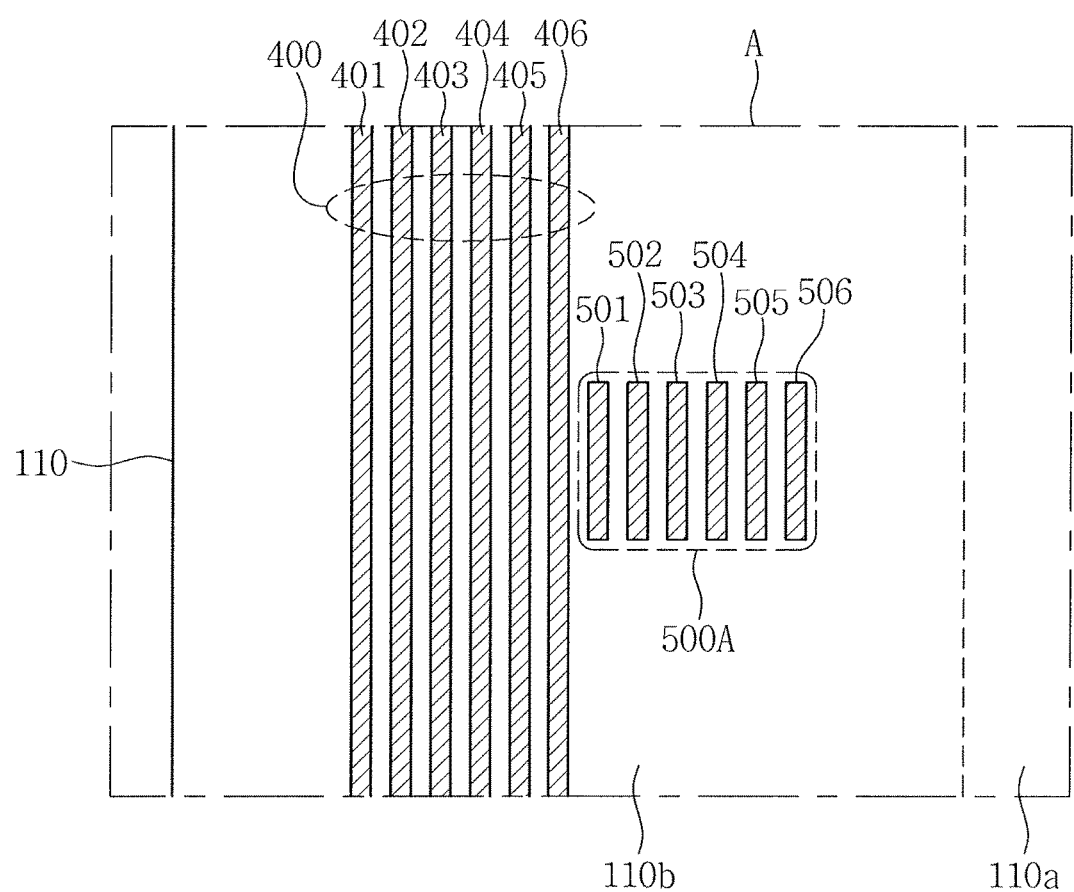
FIG. 3 illustrates an enlarged view of portion A of FIG. 2.

As illustrated in FIG. 3, an alignment key 500A (hereinafter "first alignment key") at portion A is disposed between the crack prevention portion 400 and the display area 110a. For example, the first alignment key 500A may be disposed between the sixth crack prevention pattern 406 and the display area 110a.

When the display device 300 includes only alignment keys of a substantially same type as the type of the first alignment key 500A among alignment keys at portions A, B, C, D, E, F, G, H, and I of FIG. 2, the first, second, third, fourth, fifth and sixth crack prevention patterns 401, 402, 403, 404, 405 and 406 may have a continuous line (or curved line) shape continuously enclosing other sides of the display area 110a except the opposing side described above.

As illustrated in FIG. 3, the first alignment key 500A may include a plurality of alignment patterns 501, 502, 503, 504, 505, and 506. The plurality of alignment patterns 501, 502, 503, 504, 505, and 506 are disposed between the sixth crack prevention pattern 406 and the display area 110a. The plurality of alignment patterns 501, 502, 503, 504, 505, and 506 are at the non-display area 110b, spaced apart from one another at a predetermined distance. The plurality of alignment patterns 501, 502, 503, 504, 505, and 506 are disposed along a longitudinal direction of the gate line 151.

The plurality of alignment patterns 501, 502, 503, 504, 505, and 506 are disposed at different distances from the display area 110a. For example, among the plurality of alignment patterns 501, 502, 503, 504, 505, and 506, a first alignment pattern 501 is disposed farthest from the display area 110a, and a sixth alignment pattern 506 is disposed most adjacent to the display area 110a. A second alignment pattern 502 is disposed more adjacent to the display area 110a than the first alignment pattern 501 is to the display area 110a, a third alignment pattern 503 is disposed more adjacent to the display area 110a than the second alignment pattern 502 is to the display area 110a, a fourth alignment pattern 504 is disposed more adjacent to the display area 110a than the third alignment pattern 503 is to the display area 110a, a fifth alignment pattern 505 is disposed more adjacent to the display area 110a than the fourth alignment pattern 504 is to the display area 110a, and a sixth alignment pattern 506 is disposed more adjacent to the display area 110a than the fifth alignment pattern 505 is to the display area 110a.

A distance between one alignment pattern and another alignment pattern adjacent thereto may be substantially the same as a distance between said one alignment pattern and still another alignment pattern adjacent thereto. For example, a distance between the first alignment pattern 501 and the second alignment pattern 502 may be substantially the same as a distance between the second alignment pattern 502 and the third alignment pattern 503. As a more detailed example, a distance between adjacent alignment patterns may be about 2 µm.

A distance between one crack prevention pattern and another crack prevention pattern adjacent thereto may be substantially the same as a distance between said one crack prevention pattern and still another crack prevention pattern adjacent thereto. For example, a distance between the first crack prevention pattern 401 and the second crack prevention pattern 402 may be substantially the same as a distance between the second crack prevention pattern 402 and the third crack prevention pattern 403. As a more detailed example, a distance between adjacent ones of the crack prevention patterns may be about 2 µm.

A distance between adjacent ones of the alignment patterns may be the same as or different from a distance between adjacent ones of the crack prevention patterns. For example, a distance between adjacent ones of the alignment patterns may be less than a distance between adjacent ones of the crack prevention patterns. As a more detailed example, a distance between the first alignment pattern 501 and the second alignment pattern 502 may be less than a distance between the fifth crack prevention pattern 405 and the sixth crack prevention pattern 406.

Each of the alignment patterns 501, 502, 503, 504, 505, and 506 may have a substantially same width or different widths. For example, each of the alignment patterns 501, 502, 503, 504, 505, and 506 may have a thickness of about 2 μm.

Each of the crack prevention patterns 401, 402, 403, 404, 405 and 406 may have a substantially same width or different widths. For example, each of the crack prevention patterns 401, 402, 403, 404, 405 and 406 may have a thickness of about 2 μm.

The alignment pattern may have a substantially same thickness as or a different width from that of the crack prevention pattern.

Figure 4:
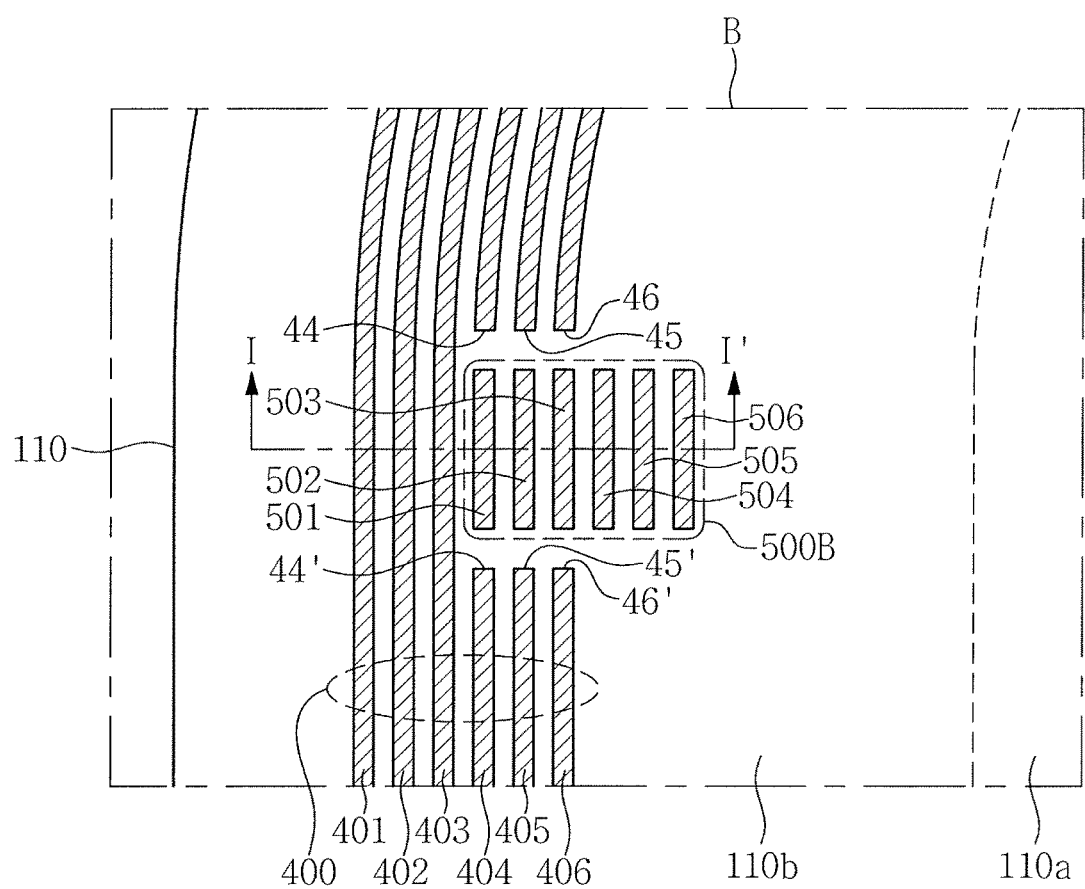
FIG. 4 illustrates an enlarged view of portion B of FIG. 2.

FIG. 4 is an enlarged view illustrating portion B of FIG. 2.

As illustrated in FIG. 4, an alignment key 500B (hereinafter "second alignment key") at portion B is disposed between the crack prevention portion 400 and the display area 110a. In addition, a portion of the second alignment key 500B may be disposed between facing end portions of the crack prevention portion 400. For example, the second alignment key 500B is disposed between the third crack prevention pattern 403 and the display area 110a. In such an exemplary embodiment, a portion of the second alignment key 500B may be disposed between facing end portions 44 and 44' of the fourth crack prevention pattern 404, between facing end portions 45 and 45' of the fifth crack prevention pattern 405, and between facing end portions 46 and 46' of the sixth crack prevention pattern 406.

The fourth crack prevention pattern 404, the fifth crack prevention pattern 405 and the sixth crack prevention pattern 406 are disposed between the third crack prevention pattern 403 and the display area 110a.

When the display device 300 includes only alignment keys of a substantially same type as the type of the second alignment key 500B among alignment keys at portions A, B, C, D, E, F, G, H, and I of FIG. 2, at least one of the first, second, and third crack prevention patterns 401, 402, and 403 may have a continuous line (or curved line) shape continuously enclosing other sides of the display area 110a except the opposing side described above. In addition, each of the fourth, fifth and sixth crack prevention patterns 404, 405, and 406 may have a discontinuous line (or curved line) shape. In an alternative exemplary embodiment, at least one of the first, second, third, fourth, fifth and sixth crack prevention patterns 401, 402, 403, 404, 405 and 406 may have a discontinuous line shape as a whole, but have a continuous line (or curved line) shape between different alignment keys. In other words, at least one of the first, second, third, fourth, fifth, and sixth crack prevention patterns 401, 402, 403, 404, 405 and 406 may have a partially continuous line shape. For example, as illustrated in FIG. 2, the fifth crack prevention pattern 405 has a discontinuous line shape as a whole, but has a continuous line (or curved line) shape between the second alignment key 500B at portion B and an alignment key 500c at portion C to be described below.

As illustrated in FIG. 4, the second alignment key 500B may include a plurality of alignment patterns 501, 502, 503, 504, 505, and 506, as illustrated in FIG. 4. The plurality of alignment patterns 501, 502, 503, 504, 505, and 506 included in the second alignment key 500B are disposed between the third crack prevention pattern 403 and the display area 110a.

As an example illustrated in FIG. 4, the first alignment pattern 501 of the second alignment key 500B is disposed between the facing end portions 44 and 44' of the fourth crack prevention pattern 404, the second alignment pattern 502 of the second alignment key 500B is disposed between the facing end portions 45 and 45' of the fifth crack prevention pattern 405, and the third alignment pattern 503 of the second alignment key 500B may be disposed between the facing end portions 46 and 46' of the sixth crack prevention pattern 406.

The plurality of alignment patterns 501, 502, 503, 504, 505, and 506 included in the second alignment key 500B are spaced apart from each other at a predetermined distance and disposed at the non-display area 110b. The plurality of alignment patterns 501, 502, 503, 504, 505, and 506 included in the second alignment key 500B are disposed along a longitudinal direction of the gate line 151.

The plurality of alignment patterns 501, 502, 503, 504, 505, and 506 included in the second alignment key 500B are disposed at different distances from the display area 110a. For example, among the plurality of alignment patterns 501, 502, 503, 504, 505, and 506 included in the second alignment key 500B, a first alignment pattern 501 is disposed farthest from the display area 110a, and a sixth alignment pattern 506 is disposed most adjacent to the display area 110a. a second alignment pattern 502 is disposed more adjacent to the display area 110a than the first alignment pattern 501 is thereto, a third alignment pattern 503 is disposed more adjacent to the display area 110a than the second alignment pattern 502 is thereto, a fourth alignment pattern 504 is disposed more adjacent to the display area 110a than the third alignment pattern 503 is thereto, a fifth alignment pattern 505 is disposed more adjacent to the display area 110a than the fourth alignment pattern 504 is thereto, and a sixth alignment pattern 506 is disposed more adjacent to the display area 110a than the fifth alignment pattern 505 is thereto.

A distance between one alignment pattern and another alignment pattern adjacent thereto may be substantially the same as a distance between said one alignment pattern and still another alignment pattern adjacent thereto. For example, a distance between the first alignment pattern 501 and the second alignment pattern 502 may be substantially the same as a distance between the second alignment pattern 502 and the third alignment pattern 503. As a more detailed example, a distance between adjacent alignment patterns may be about 2 μm.

A distance between one crack prevention pattern and another crack prevention pattern adjacent thereto may be substantially the same as a distance between said one crack prevention pattern and still another crack prevention pattern adjacent thereto. For example, a distance between the first crack prevention pattern 401 and the second crack prevention pattern 402 may be substantially the same as a distance between the second crack prevention pattern 402 and the third crack prevention pattern 403. As a more detailed example, a distance between adjacent ones of the crack prevention patterns may be about 2 μm.

A distance between adjacent ones of the alignment patterns may be substantially the same as or different from a distance between adjacent ones of the crack prevention patterns. For example, a distance between adjacent ones of the alignment patterns may be less than a distance between adjacent ones of the crack prevention patterns. As a more detailed example, a distance between the first alignment pattern 501 and the second alignment pattern 502 may be less than a distance between the fifth crack prevention pattern 405 and the sixth crack prevention pattern 406.

Each of the alignment patterns 501, 502, 503, 504, 505, and 506 may have a substantially same width or different widths. For example, each of the alignment patterns 501, 502, 503, 504, 505, and 506 may have a thickness of about 2 μm.

Each of the crack prevention patterns 401, 402, 403, 404, 405 and 406 may have a substantially same width or different widths. For example, each of the crack prevention patterns 401, 402, 403, 404, 405 and 406 may have a thickness of about 2 μm.

The alignment pattern may have a substantially same thickness as or a different width from that of the crack prevention pattern.

Based on the configuration illustrated in FIG. 4, since a portion of the second alignment key 500B is disposed between end portions of the crack prevention patterns, an area occupied by the second alignment key 500B may be reduced in the non-display area 110*b*.

Figure 5:
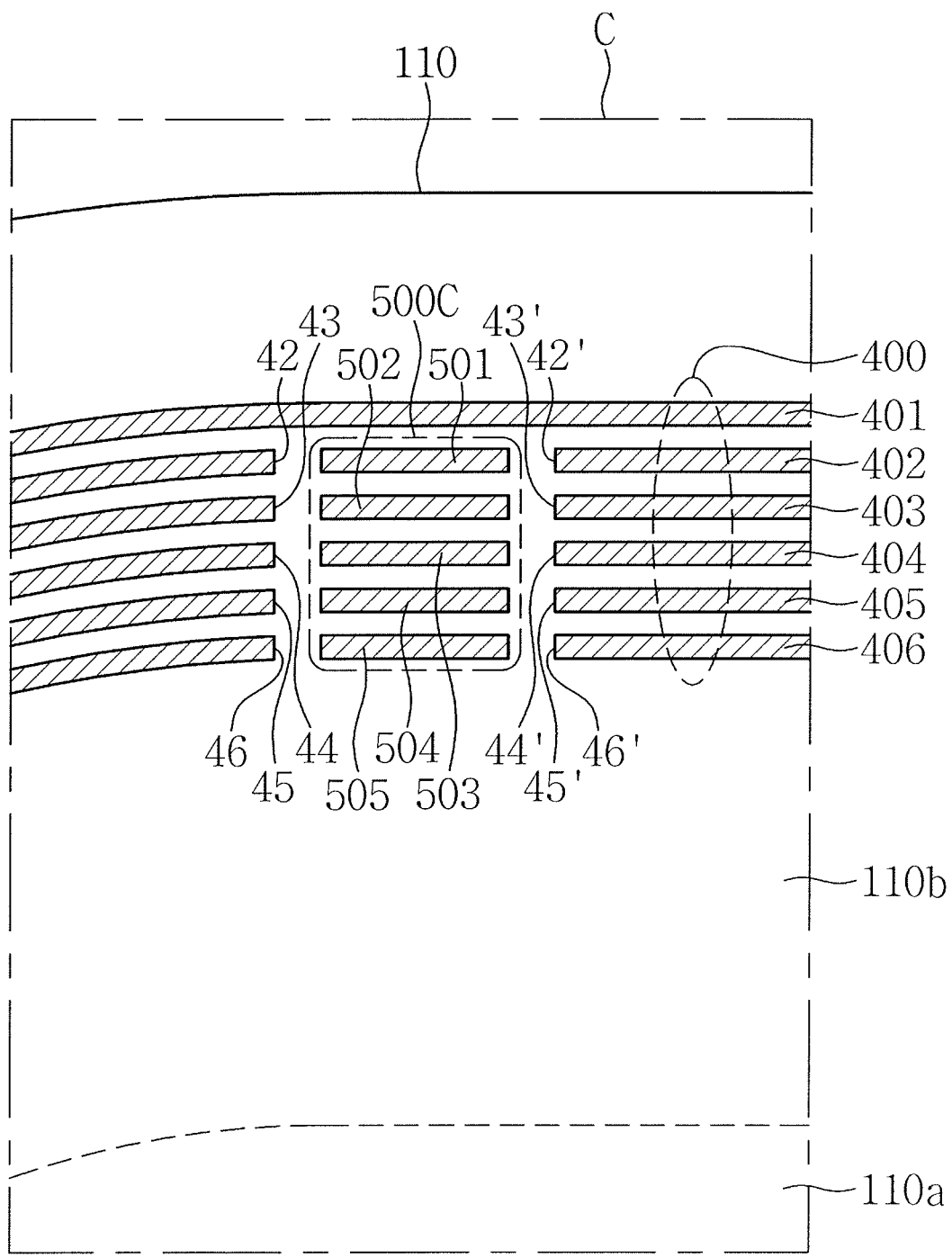
FIG. 5 illustrates an enlarged view of portion C of FIG. 2.

FIG. 5 is an enlarged view illustrating portion C of FIG. 2.

As illustrated in FIG. 5, an alignment key 500C (hereinafter "third alignment key") at portion C is disposed between the crack prevention portion 400 and the display area 110*a*. In addition, the third alignment key 500C is disposed between facing end portions of the crack prevention portion 400. For example, the third alignment key 500C is disposed between the first crack prevention pattern 401 and the display area 110*a*. In such an exemplary embodiment, the third alignment key 500C may be disposed between facing end portions 42 and 42' of the second crack prevention pattern 402, between facing end portions 43 and 43' of the third crack prevention pattern 403, between facing end portions 44 and 44' of the fourth crack prevention pattern 404 between facing end portions 45 and 45' of the fifth crack prevention pattern 405, and between facing end portions 46 and 46' of the sixth crack prevention pattern 406.

The second crack prevention pattern 402, the third crack prevention pattern 403, the fourth crack prevention pattern 404, the fifth crack prevention pattern 405 and the sixth crack prevention pattern 406 are disposed between the first crack prevention pattern 401 and the display area 110*a*.

When the display device 300 includes only alignment keys of a substantially same type as the type of the third alignment key 500C among alignment keys at portions A, B, C, D, E, F, G, H, and I of FIG. 2, the first crack prevention pattern 401 may have a continuous line (or curved line) shape enclosing other sides of the display area 110*a* except the first side described above. In addition, the second, third, fourth, fifth, and sixth crack prevention patterns 402, 403, 404, 405, and 406 may have a discontinuous line (or curved line) shape. In an alternative exemplary embodiment, at least one of the first, second, third, fourth, fifth and sixth crack prevention patterns 401, 402, 403, 404, 405 and 406 may have a discontinuous line shape as a whole, but have a continuous line (or curved line) shape between different alignment keys. In other words, at least one of the first, second, third, fourth, fifth, and sixth crack prevention patterns 401, 402, 403, 404, 405 and 406 may have a partially continuous line shape.

As illustrated in FIG. 5, the third alignment key 500C may include a plurality of alignment patterns 501, 502, 503, 504, and 505. The plurality of alignment patterns 501, 502, 503, 504, and 505 included in the third alignment key 500C are disposed between the first crack prevention pattern 401 and the display area 110*a*.

As an example illustrated in FIG. 5, the first alignment pattern 501 of the third alignment key 500C may be disposed between the facing end portions 42 and 42' of the second crack prevention pattern 402, the second alignment pattern 502 of the third alignment key 500C may be disposed between the facing end portions 43 and 43' of the third crack prevention pattern 403, the third alignment pattern 503 of the third alignment key 500C may be disposed between the facing end portions 44 and 44' of the fourth crack prevention pattern 404, the fourth alignment pattern 504 of the third alignment key 500C may be disposed between the facing end portions 45 and 45' of the fifth crack prevention pattern 405, and the fifth alignment pattern 505 of the third alignment key 500C may be disposed between the facing end portions 46 and 46' of the sixth crack prevention pattern 406.

The plurality of alignment patterns 501, 502, 503, 504, and 505 included in the third alignment key 500C are spaced apart from each other at a predetermined distance and disposed at the non-display area 110*b*. The plurality of alignment patterns 501, 502, 503, 504, and 505 included in the third alignment key 500C are disposed along a longitudinal direction of the data line 171.

The plurality of alignment patterns 501, 502, 503, 504, and 505 included in the third alignment key 500C are disposed at different distances from the display area 110*a*. For example, among the plurality of alignment patterns 501, 502, 503, 504, 505, and 506 included in the third alignment key 500C, the first alignment pattern 501 is disposed farthest from the display area 110*a*, and the fifth alignment pattern 505 is disposed most adjacent to the display area 110*a*. The second alignment pattern 502 is disposed more adjacent to the display area 110*a* than the first alignment pattern 501 is thereto, the third alignment pattern 503 is disposed more adjacent to the display area 110*a* than the second alignment pattern 502 is thereto, the fourth alignment pattern 504 is disposed more adjacent to the display area 110*a* than the third alignment pattern 503 is thereto, and the fifth alignment pattern 505 is disposed more adjacent to the display area 110*a* than the fourth alignment pattern 504 is thereto.

A distance between one alignment pattern and another alignment pattern adjacent thereto may be substantially the same as a distance between said one alignment pattern and still another alignment pattern adjacent thereto. For example, a distance between the first alignment pattern 501 and the second alignment pattern 502 may be substantially the same as a distance between the second alignment pattern 502 and the third alignment pattern 503. As a more detailed example, a distance between adjacent alignment patterns may be about 2 μm.

A distance between one crack prevention pattern and another crack prevention pattern adjacent thereto may be substantially the same as a distance between said one crack prevention pattern and still another crack prevention pattern adjacent thereto. For example, a distance between the first crack prevention pattern 401 and the second crack prevention pattern 402 may be substantially the same as a distance between the second crack prevention pattern 402 and the third crack prevention pattern 403. As a more detailed example, a distance between adjacent ones of the crack prevention patterns may be about 2 μm.

A distance between adjacent ones of the alignment patterns may be substantially the same as or different from a distance between adjacent ones of the crack prevention patterns. For example, a distance between adjacent ones of the alignment patterns may be less than a distance between adjacent ones of the crack prevention patterns. As a more detailed example, a distance between the first alignment pattern 501 and the second alignment pattern 502 may be less than a distance between the fifth crack prevention pattern 405 and the sixth crack prevention pattern 406.

Each of the alignment patterns 501, 502, 503, 504, and 505 may have a substantially same width or different widths. For example, each of the alignment patterns 501, 502, 503, 504, 505, and 506 may have a thickness of about 2 µm.

Each of the crack prevention patterns 401, 402, 403, 404, 405 and 406 may have a substantially same width or different widths. For example, each of the crack prevention patterns 401, 402, 403, 404, 405 and 406 may have a thickness of about 2 µm.

The alignment pattern may have a substantially same thickness as or a different width from that of the crack prevention pattern.

Based on the configuration illustrated in FIG. 5, since an entire portion of the third alignment key 500C is disposed between end portions of the crack prevention patterns, an area occupied by the third alignment key 500C may further be reduced in the non-display area 110*b*.

Figure 6:
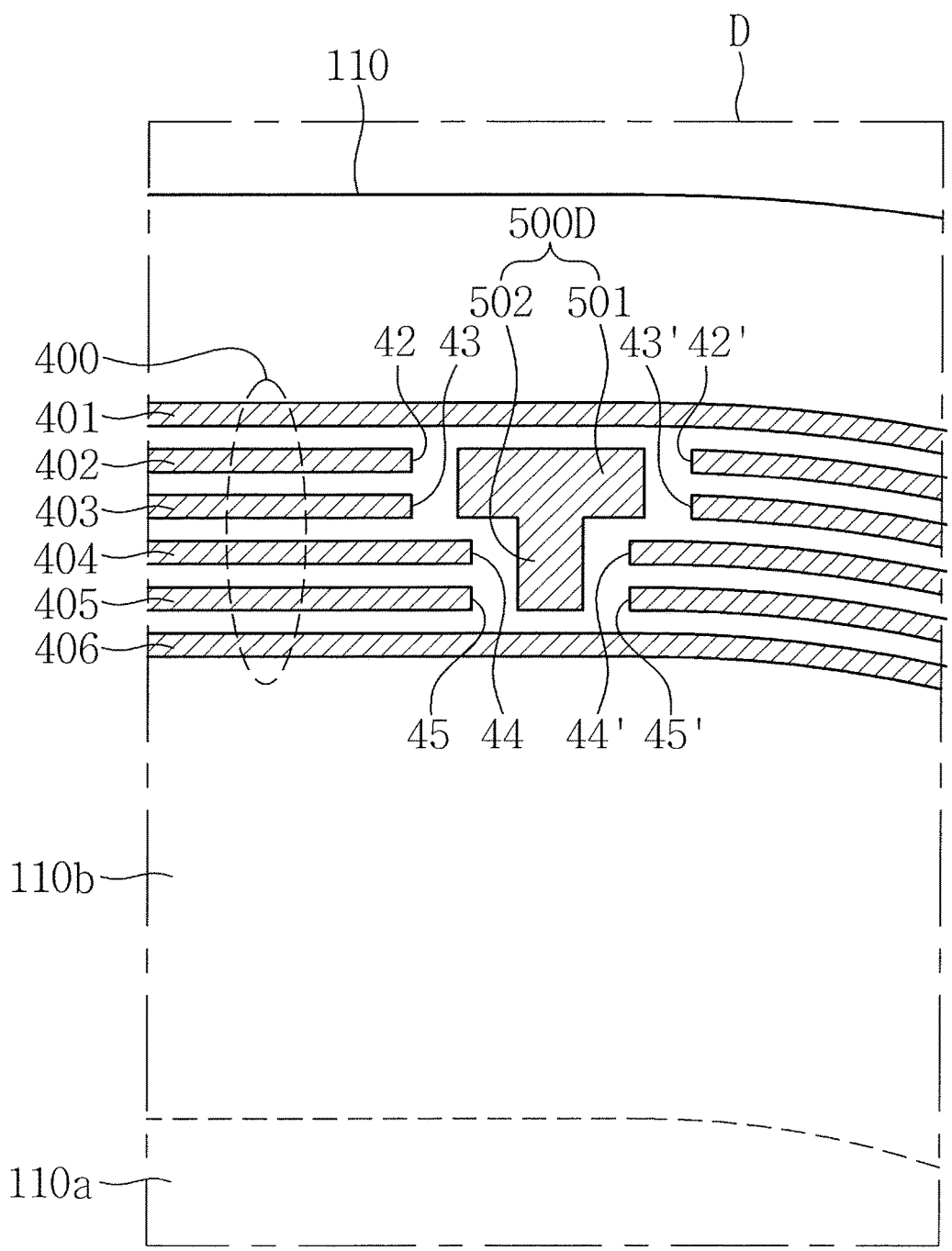
FIG. 6 illustrates an enlarged view of portion D of FIG. 2.

FIG. 6 is an enlarged view illustrating portion D of FIG. 2.

As illustrated in FIG. 6, an alignment key 500D (hereinafter "fourth alignment key") at portion D is disposed between two different crack prevention patterns 401 and 406. In addition, a portion of the fourth alignment key 500D is disposed between facing end portions of at least one crack prevention pattern between the two crack prevention patterns 401 and 406. For example, at least a portion of the fourth alignment key 500D is disposed between the first crack prevention pattern 401 and the sixth crack prevention pattern 406. In such an exemplary embodiment, at least a portion of the fourth alignment key 500D may be disposed between facing end portions 42 and 42' of the second crack prevention pattern 402, between facing end portions 43 and 43' of the third crack prevention pattern 403, between facing end portions 44 and 44' of the fourth crack prevention pattern 404, and between facing end portions 45 and 45' of the fifth crack prevention pattern 405.

When the display device 300 includes only alignment keys of a substantially same type as the type of the fourth alignment key 500D among alignment keys at portions A, B, C, D, E, F, G, H, and I of FIG. 2, each of the first crack prevention pattern 401 and the sixth crack prevention pattern 406 may have a continuous line (or curved line) shape enclosing other sides of the display area 110*a* except the opposing side described above. In addition, the second, third, fourth and fifth crack prevention patterns 402, 403, 404 and 405 may have a discontinuous line (or curved line) shape. In an alternative exemplary embodiment, the sixth crack prevention pattern 406 may have a discontinuous line shape. In such an exemplary embodiment, at least one of the first, second, third, fourth, fifth and sixth crack prevention patterns 401, 402, 403, 404, 405 and 406 may have a discontinuous line shape as a whole, but have a continuous line (or curved line) shape between alignment keys.

As illustrated in FIG. 6, the fourth alignment key 500D includes a first alignment pattern 501 extending in the longitudinal direction of the gate line 151 and a second alignment pattern 502 extending from a central portion of the first alignment pattern 501 toward the display area 110*a*. The second alignment pattern 502 extends in the longitudinal direction of the data line 171. The first and second alignment patterns 501 and 502 may be disposed between the first crack prevention pattern 401 and the sixth crack prevention pattern 406.

As an example illustrated in FIG. 6, a portion of the first alignment pattern 501 included in the fourth alignment key 500D may be disposed between the facing end portions 42 and 42' of the second crack prevention pattern 402, another portion of the first alignment pattern 501 included in the fourth alignment key 500D may be disposed between the facing end portions 43 and 43' of the third crack prevention pattern 403, a portion of the second alignment pattern 502 included in the fourth alignment key 500D may be disposed between the facing end portions 44 and 44' of the fourth crack prevention pattern 404, and another portion of the second alignment pattern 502 included in the fourth alignment key 500D may be disposed between the facing end portions 45 and 45' of the fifth crack prevention pattern 405.

A distance between one crack prevention pattern and another crack prevention pattern adjacent thereto may be substantially the same as a distance between said one crack prevention pattern and still another crack prevention pattern adjacent thereto. For example, a distance between the first crack prevention pattern 401 and the second crack prevention pattern 402 may be substantially the same as a distance between the second crack prevention pattern 402 and the third crack prevention pattern 403. As a more detailed example, a distance between adjacent ones of the crack prevention patterns may be about 2 µm.

Each of the alignment patterns 501 and 502 may have a substantially same width or different widths. For example, each of the alignment patterns 501, 502, 503, 504, 505, and 506 may have a thickness of about 2 µm.

Each of the crack prevention patterns 401, 402, 403, 404, 405 and 406 may have a substantially same width or different widths. For example, each of the crack prevention patterns 401, 402, 403, 404, 405 and 406 may have a thickness of about 2 µm.

The alignment pattern may have a substantially same thickness as or a different width from that of the crack prevention pattern.

Based on the configuration illustrated in FIG. 6, since an entire portion of the fourth alignment key 500D is disposed between end portions of the crack prevention patterns, an area occupied by the fourth alignment key 500D may further be reduced in the non-display area 110*b*.

Figure 7:
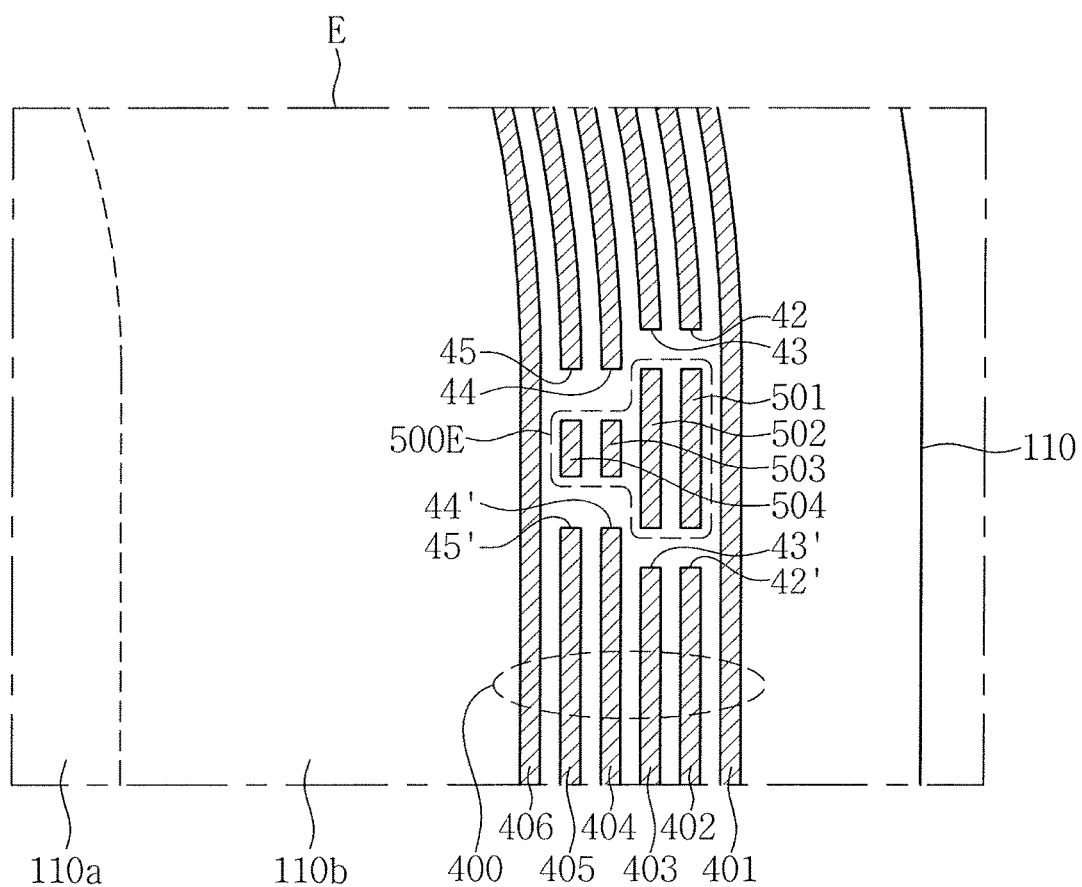
FIG. 7 illustrates an enlarged view of portion E of FIG. 2.

FIG. 7 is an enlarged view illustrating portion E of FIG. 2

As illustrated in FIG. 7, an alignment key 500E (hereinafter "fifth alignment key") at portion E is disposed between two different crack prevention patterns 401 and 406. In addition, the fifth alignment key 500E is disposed between facing end portions of at least one crack prevention pattern between the two crack prevention patterns 401 and 406. For example, the fifth alignment key 500E is disposed between the first crack prevention pattern 401 and the sixth crack prevention pattern 406. In such an exemplary embodiment, the fifth alignment key 500E may be disposed between facing end portions 42 and 42' of the second crack prevention pattern 402, between facing end portions 43 and 43' of the third crack prevention pattern 403, between facing end portions 44 and 44' of the fourth crack prevention pattern 404, and between facing end portions 45 and 45' of the fifth crack prevention pattern 405.

When the display device 300 includes only alignment keys of a substantially same type as the type of the fifth alignment key 500E among alignment keys at portions A, B, C, D, E, F, G, H, and I of FIG. 2, each of the first crack prevention pattern 401 and the sixth crack prevention pattern 406 may have a continuous line (or curved line) shape enclosing other sides of the display area 110a except the opposing side described above. In addition, the second, third, fourth and fifth crack prevention patterns 402, 403, 404 and 405 may have a discontinuous line (or curved line) shape. In an alternative exemplary embodiment, the sixth crack prevention pattern 406 may have a discontinuous line shape. In such an exemplary embodiment, at least one of the first, second, third, fourth, fifth and sixth crack prevention patterns 401, 402, 403, 404, 405 and 406 may have a discontinuous line shape as a whole, but have a continuous line (or curved line) shape between different alignment keys.

As illustrated in FIG. 7, the fifth alignment key 500E may include a plurality of alignment patterns 501, 502, 503, and 504. The plurality of alignment patterns 501, 502, 503, and 504 included in the fifth alignment key 500E are disposed between the first crack prevention pattern 401 and the sixth crack prevention pattern 406.

As an example illustrated in FIG. 7, a first alignment pattern 501 of the fifth alignment key 500E is disposed between the facing end portions 42 and 42' of the second crack prevention pattern 402, a second alignment pattern 502 of the fifth alignment key 500E is disposed between the facing end portions 43 and 43' of the third crack prevention pattern 403, a third alignment pattern 503 of the fifth alignment key 500E may be disposed between the facing end portions 44 and 44' of the fourth crack prevention pattern 404, and a fourth alignment pattern 504 of the fifth alignment key 500E may be disposed between the facing end portions 45 and 45' of the fifth crack prevention pattern 405.

The plurality of alignment patterns 501, 502, 503, and 504 included in the fifth alignment key 500E are spaced apart from each other at a predetermined distance and disposed at the non-display area 110b. The plurality of alignment patterns 501, 502, 503, and 504 included in the fifth alignment key 500E are disposed along the longitudinal direction of the data line 171.

The plurality of alignment patterns 501, 502, 503, and 504 included in the fifth alignment key 500E are disposed at different distances from the display area 110a. For example, among the plurality of alignment patterns 501, 502, 503, and 504 included in the fifth alignment key 500E, the first alignment pattern 501 is disposed farthest from the display area 110a, and the fourth alignment pattern 504 is disposed most adjacent to the display area 110a. The second alignment pattern 502 is disposed more adjacent to the display area 110a than the first alignment pattern 501 is thereto, the third alignment pattern 503 is disposed more adjacent to the display area 110a than the second alignment pattern 502 is thereto, and the fourth alignment pattern 504 is disposed more adjacent to the display area 110a than the third alignment pattern 503 is thereto.

A distance between one alignment pattern and another alignment pattern adjacent thereto may be substantially the same as a distance between said one alignment pattern and still another alignment pattern adjacent thereto. For example, a distance between the first alignment pattern 501 and the second alignment pattern 502 may be substantially the same as a distance between the second alignment pattern 502 and the third alignment pattern 503. As a more detailed example, a distance between adjacent alignment patterns may be about 2 μm.

A distance between one crack prevention pattern and another crack prevention pattern adjacent thereto may be substantially the same as a distance between said one crack prevention pattern and still another crack prevention pattern adjacent thereto. For example, a distance between the first crack prevention pattern 401 and the second crack prevention pattern 402 may be substantially the same as a distance between the second crack prevention pattern 402 and the third crack prevention pattern 403. As a more detailed example, a distance between adjacent ones of the crack prevention patterns may be about 2 μm.

A distance between adjacent ones of the alignment patterns may be the same as or different from a distance between adjacent ones of the crack prevention patterns. For example, a distance between adjacent ones of the alignment patterns may be less than a distance between adjacent ones of the crack prevention patterns. As a more detailed example, a distance between the first alignment pattern 501 and the second alignment pattern 502 may be less than a distance between the fifth crack prevention pattern 405 and the sixth crack prevention pattern 406.

Each of the alignment patterns 501, 502, 503, and 504 may have a substantially same width or different widths. For example, each of the alignment patterns 501, 502, 503, and 504 may have a thickness of about 2 μm.

Each of the crack prevention patterns 401, 402, 403, 404, 405 and 406 may have a substantially same width or different widths. For example, each of the crack prevention patterns 401, 402, 403, 404, 405 and 406 may have a thickness of about 2 μm.

The alignment pattern may have a substantially same thickness as or a different width from that of the crack prevention pattern.

Based on the configuration illustrated in FIG. 7, since an entire portion of the fifth alignment key 500E is disposed between end portions of the crack prevention patterns, an area occupied by the fifth alignment key 500E may be reduced in the non-display area 110b.

Figure 8:
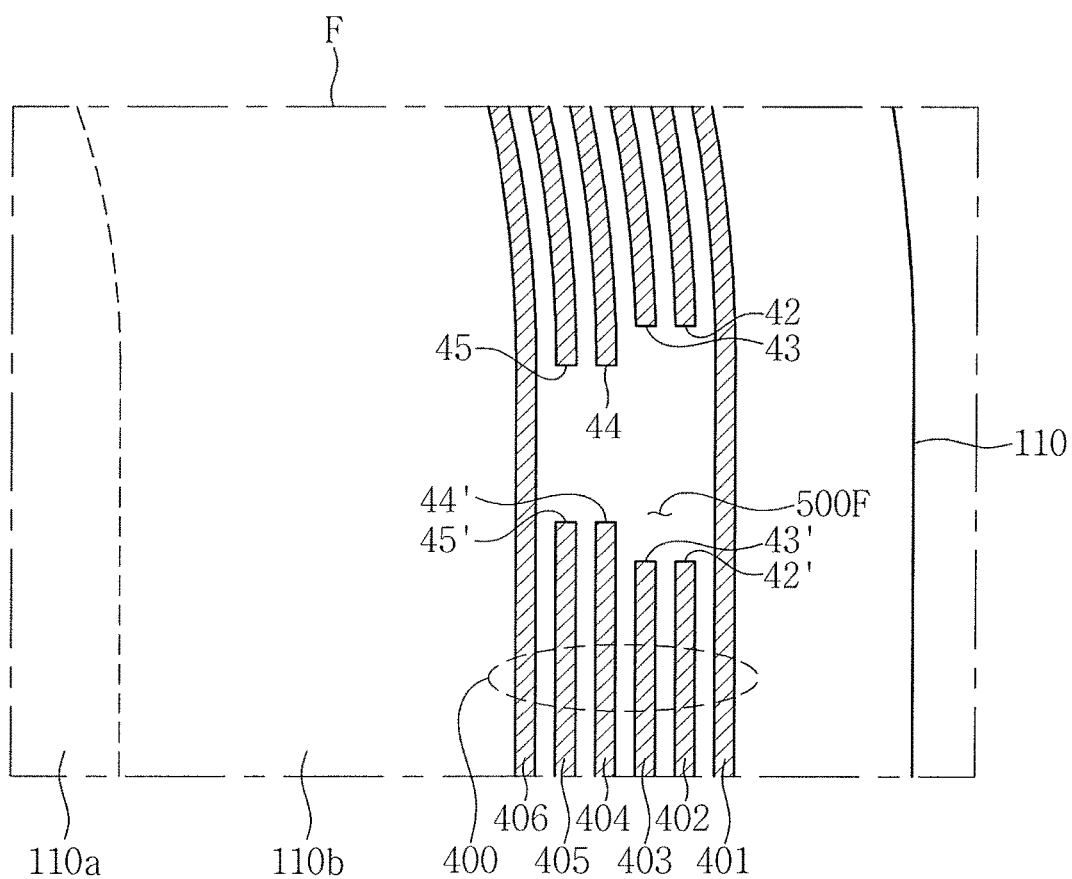
FIG. 8 illustrates an enlarged view of portion F of FIG. 2.

FIG. 8 is an enlarged view illustrating portion F of FIG. 2.

As illustrated in FIG. 8, an alignment key 500F (hereinafter "sixth alignment key") at portion F may be depressed in shape as illustrated in FIG. 8. That is, the sixth alignment key 500F is an alignment area, e.g., an opening through some of the crack prevention patterns.

The sixth alignment key 500F (or an alignment area) having the depressed shape may be defined by a plurality of crack prevention patterns disposed adjacent to the sixth alignment key 500F. For example, a groove defined by being surrounded by two facing crack prevention patterns, e.g., the first crack prevention pattern 401 and the sixth crack prevention pattern 406, and facing end portions of at least one crack prevention pattern disposed between the two facing crack prevention patterns is the sixth alignment key 500F. For example, as illustrated in FIG. 8, the first crack prevention pattern 401, the sixth crack prevention pattern 406 facing the first crack prevention pattern 401, facing end portions 42 and 42' of the second crack prevention pattern 402, facing end portions 43 and 43' of the third crack prevention pattern 403, facing end portions 44 and 44' of the fourth crack prevention pattern 404, and facing portions 45 and 45' of the fifth crack prevention pattern 405 is the sixth alignment key 500F.

Distances between facing end portions of respective ones of the at least two crack prevention patterns may be different from one another. For example, as illustrated in FIG. 8, a distance between the facing end portions 43 and 43' of the third crack prevention pattern 403 may be longer than a distance between the facing end portions 44 and 44' of the fourth crack prevention pattern 404.

In such an exemplary embodiment, when the display device 300 includes only alignment keys of a substantially same type as the type of the sixth alignment key 500F among alignment keys at portions A, B, C, D, E, F, G, H, and I of FIG. 2, each of the first crack prevention pattern 401 and the sixth crack prevention pattern 406 may have a continuous line (or curved line) shape enclosing other sides of the display area 110*a* except the opposing side described above. In addition, the second, third, fourth and fifth crack prevention patterns 402, 403, 404 and 405 may have a discontinuous line (or curved line) shape. In an exemplary embodiment, the sixth crack prevention pattern 406 may have a discontinuous line shape. In such an exemplary embodiment, at least one of the first, second, third, fourth, fifth and sixth crack prevention patterns 401, 402, 403, 404, 405 and 406 may have a discontinuous line shape as a whole, but have a continuous line (or curved line) shape between different alignment keys.

A distance between one crack prevention pattern and another crack prevention pattern adjacent thereto may be substantially the same as a distance between said one crack prevention pattern and still another crack prevention pattern adjacent thereto. For example, a distance between the first crack prevention pattern 401 and the second crack prevention pattern 402 may be substantially the same as a distance between the second crack prevention pattern 402 and the third crack prevention pattern 403. As a more detailed example, a distance between adjacent ones of the crack prevention patterns may be about 2 μm.

Each of the crack prevention patterns 401, 402, 403, 404, 405 and 406 may have a substantially same width or different widths. For example, each of the crack prevention patterns 401, 402, 403, 404, 405 and 406 may have a thickness of about 2 μm.

Based on the configuration illustrated in FIG. 8, since an entire portion of the sixth alignment key 500F is defined between end portions of the crack prevention patterns, an occupation area of the sixth alignment key 500F may be reduced in the non-display area 110*b*.

Figure 9:
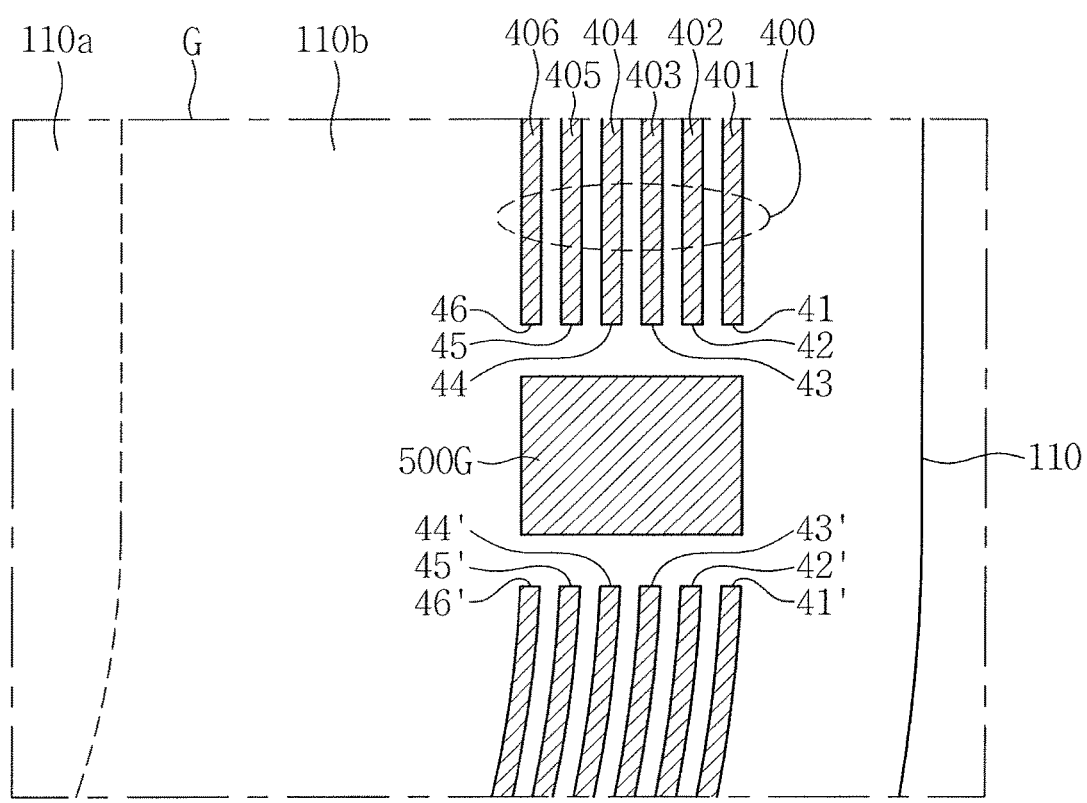
FIG. 9 illustrates an enlarged view of portion G of FIG. 2.

FIG. 9 is an enlarged view illustrating portion G of FIG. 2.

As illustrated in FIG. 9, an alignment key 500G (hereinafter "seventh alignment key") at portion G is disposed between an edge of the substrate 100 and the display area 110*a*. In addition, the seventh alignment key 500G is disposed between facing end portions of the crack prevention portion 400. For example, the seventh alignment key 500G is disposed between facing end portions 41 and 41' of the first crack prevention pattern 401, between facing end portions 42 and 42' of the second crack prevention pattern 402, between facing end portions 43 and 43' of the third crack prevention pattern 403, between facing end portions 44 and 44' of the fourth crack prevention pattern 404, between facing end portions 45 and 45' of the fifth crack prevention pattern 405, and between facing end portions 46 and 46' of the sixth crack prevention pattern 406.

When the display device 300 includes only alignment keys of a substantially same type as the type of the seventh alignment key 500G among alignment keys at portions A, B, C, D, E, F, G, H, and I of FIG. 2, each of the first, second, third, fourth, fifth and sixth crack prevention patterns 401, 402, 403, 404, 405 and 406 may have a discontinuous line (or curved line) shape. In an alternative exemplary embodiment, at least one of the first, second, third, fourth, fifth and sixth crack prevention patterns 401, 402, 403, 404, 405 and 406 may have a discontinuous line shape as a whole, but have a continuous line (or curved line) shape between different alignment keys. In other words, at least one of the first, second, third, fourth, fifth, and sixth crack prevention patterns 401, 402, 403, 404, 405 and 406 may have a partially continuous line shape.

Each of the crack prevention patterns 401, 402, 403, 404, 405 and 406 may have a substantially same width or different widths. For example, each of the crack prevention patterns 401, 402, 403, 404, 405 and 406 may have a thickness of about 2 μm.

The alignment pattern may have a substantially same thickness as or a different width from that of the crack prevention pattern.

Based on the configuration illustrated in FIG. 9, since an entire portion of the seventh alignment key 500G is disposed between end portions of the crack prevention patterns, an area occupied by the seventh alignment key 500G may be reduced in the non-display area 110*b*.

Figure 10:
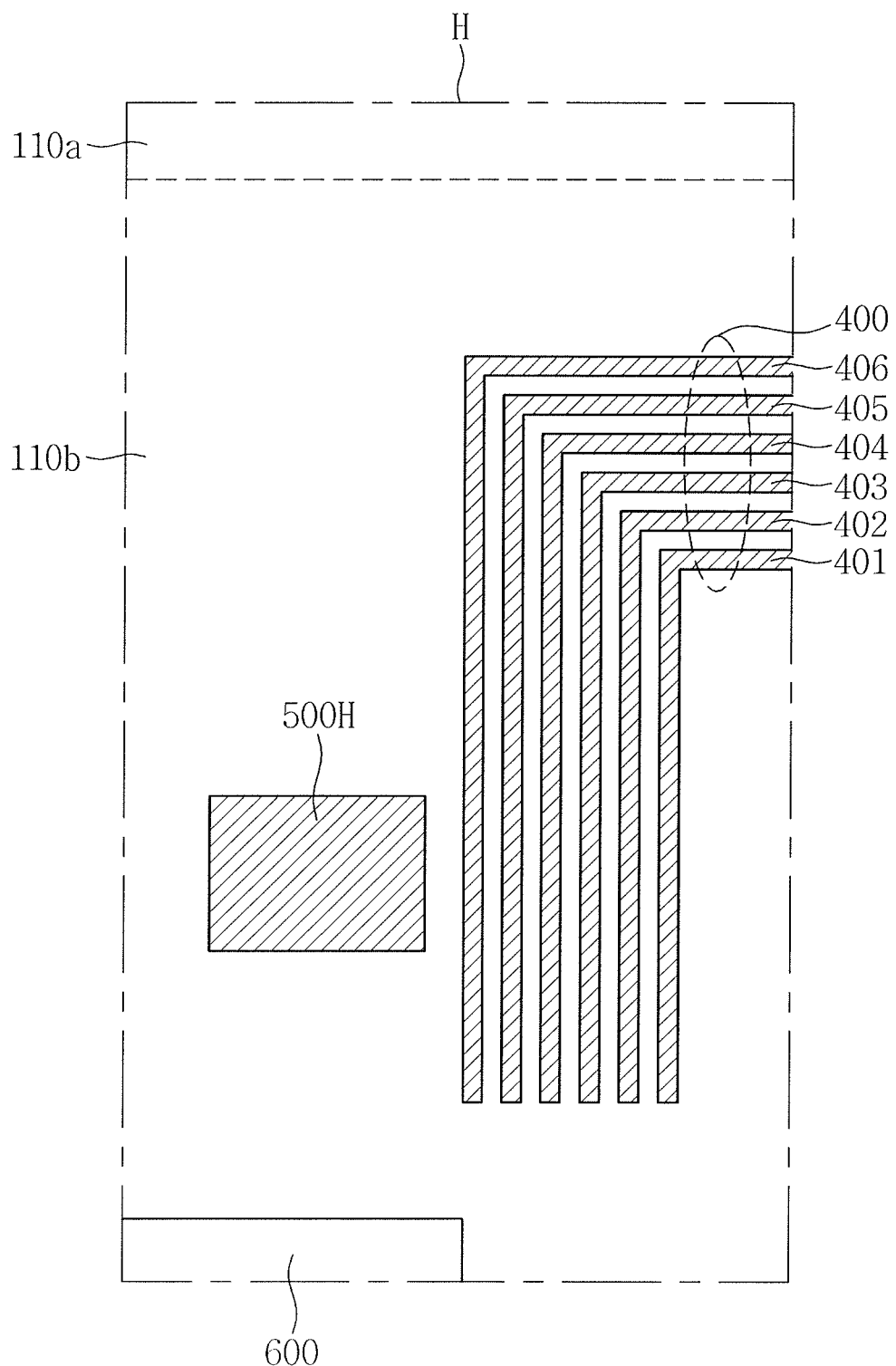
FIG. 10 illustrates an enlarged view of portion H of FIG. 2.

FIG. 10 is an enlarged view illustrating portion H of FIG. 2.

In an exemplary embodiment, although not illustrated, the seventh alignment key 500G may include a plurality of alignment patterns 501, 502, 503, 504, 505, and 506 as the second alignment key 500B of FIG. 4 described above.

FIG. 10 is an enlarged view illustrating portion H of FIG. 2.

As illustrated in FIG. 10, an alignment key 500H (hereinafter "eighth alignment key") at portion H is disposed between the driving unit 600 and the display area 110*a*.

When the display device 300 includes only alignment keys of a substantially same type as the type of the eighth alignment key 500H among alignment keys at portions A, B, C, D, E, F, G, H, and I of FIG. 2, each of the first, second, third, fourth, fifth and sixth crack prevention patterns 401, 402, 403, 404, 405 and 406 may have a continuous line (or curved line) shape enclosing other sides of the display area 110*a* except the opposing side described above.

A distance between one crack prevention pattern and another crack prevention pattern adjacent thereto may be substantially the same as a distance between said one crack prevention pattern and still another crack prevention pattern adjacent thereto. For example, a distance between the first crack prevention pattern 401 and the second crack prevention pattern 402 may be substantially the same as a distance between the second crack prevention pattern 402 and the third crack prevention pattern 403.

A distance between the eighth alignment key 500H and a crack prevention pattern adjacent thereto may be substantially the same as or different from a distance between adjacent ones of the crack prevention patterns. For example, a distance between the eighth alignment key 500H and the crack prevention pattern adjacent thereto may be less than a distance between adjacent ones of the crack prevention patterns. As a more detailed example, a distance between the eighth alignment key 500H and the sixth crack prevention pattern 406 may be less than a distance between the fifth crack prevention pattern 405 and the sixth crack prevention pattern 406.

Each of the crack prevention patterns 401, 402, 403, 404, 405 and 406 may have a substantially same width or different widths. For example, each of the crack prevention patterns 401, 402, 403, 404, 405 and 406 may have a thickness of about 2 μm.

The eighth alignment key 50011 may have a greater width than a width of one of the crack prevention patterns.

Figure 11:
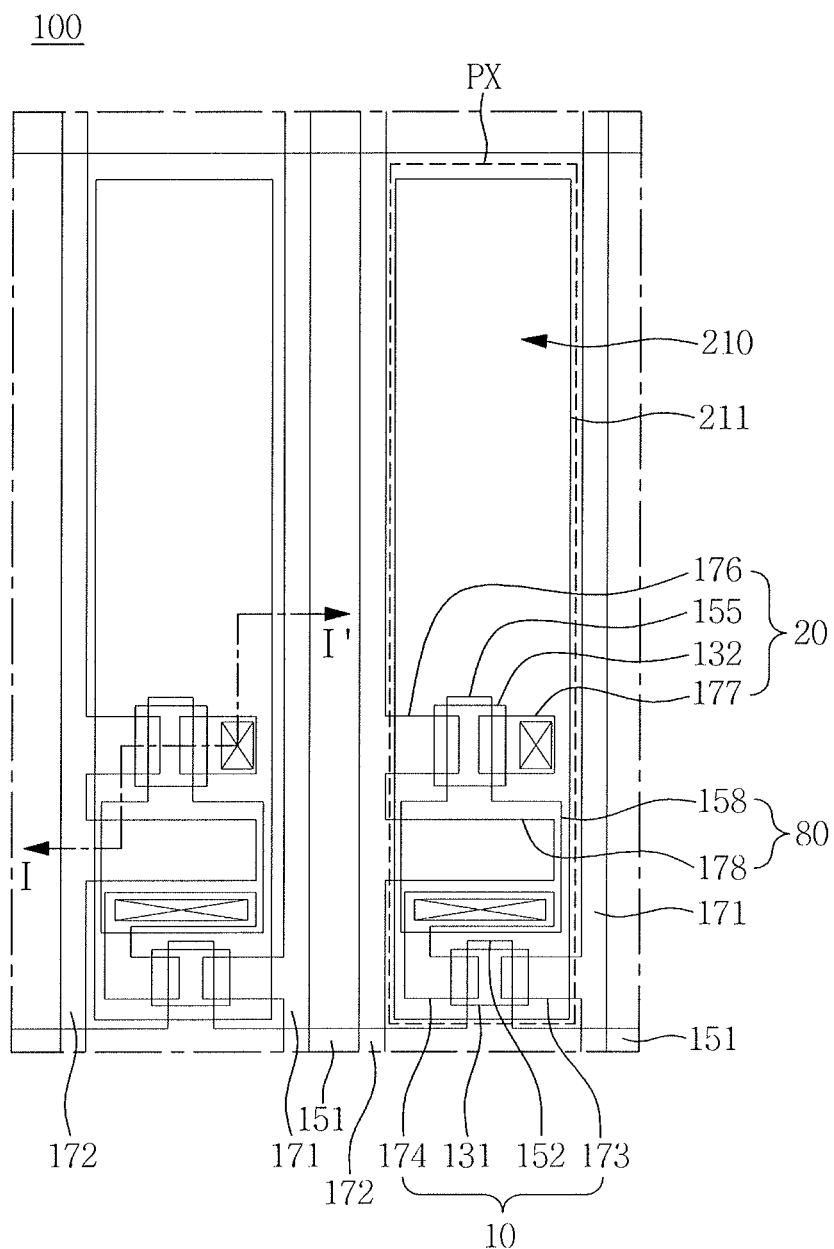
FIG. 11 illustrates a detailed configuration view of a pixel of FIG. 1.
Figure 12:
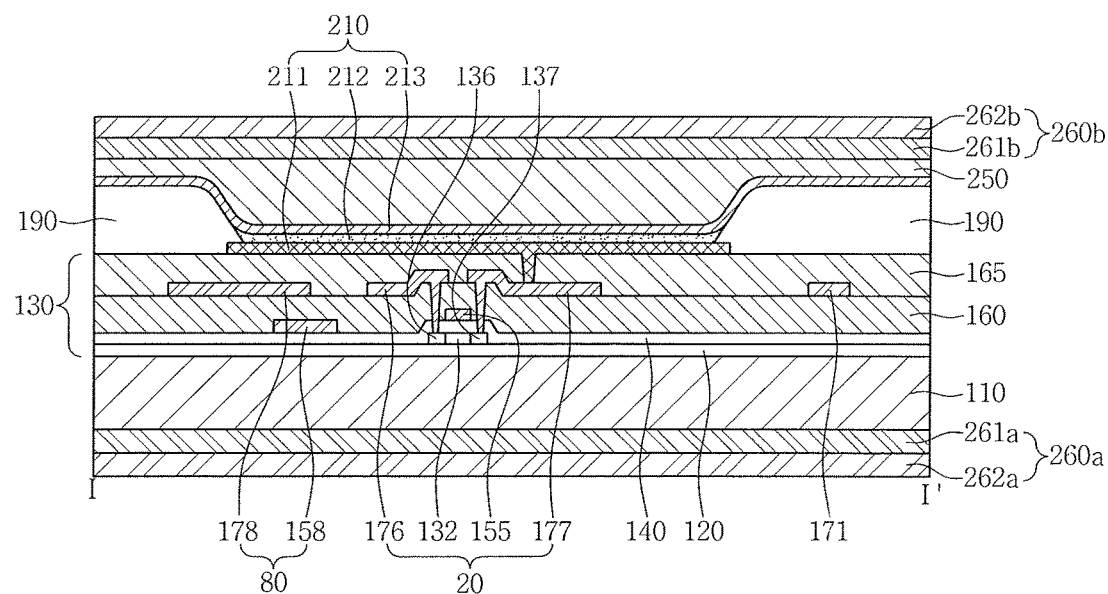
FIG. 12 illustrates a cross-sectional view taken along line I-I' of FIG. 11.

FIG. 11 is a detailed configuration view illustrating a pixel PX of FIG. 1, and FIG. 12 is a cross-sectional view taken along line I-I" of FIG. 11.

Referring to FIGS. 11 and 12, the pixel PX includes the substrate 110, a driving circuit unit 130 on the substrate 110, an OLED 210 on the driving circuit unit 130, and a sealing member 250 on the OLED 210. Each pixel PX may be disposed at an area (pixel area) defined by the gate line 151, the data line 171, and the common power line 172.

The pixel PX may further include a first coating layer 260a. As an example, the first coating layer 260a may be disposed on a rear surface of the substrate 110. In addition, the pixel PX according to an exemplary embodiment may further include a second coating layer 260b. For example, the second coating layer 260b may be disposed on the sealing member 250.

The first coating layer 260a may include at least one of a water-resistant coating layer 261a and a thermal-resistant coating layer 262a, and the second coating layer 260b may include at least one of a water-resistant coating layer 261b and a thermal-resistant coating layer 262b as well.

The driving circuit unit 130 for driving the OLED 210 is provided on the substrate 110. The driving circuit unit 130 includes a switching thin film transistor ("TFT") 10, a driving TFT 20 and a capacitor 80. The driving circuit unit 130 operates a light emitting layer 212 of the OLED.

Although the structure of the driving circuit unit 130 and the OLED 210 is illustrated in FIGS. 11 and 12, exemplary embodiments are not limited to the structure illustrated in FIGS. 11 and 12. The driving circuit unit 130 and the OLED 210 may be formed into various structures within a range that may easily be modified by those skilled in the art.

Referring to FIG. 11, each pixel PX is depicted as including two TFTs, e.g., a switching TFT 10 and a driving TFT 20, and one capacitor 80, but exemplary embodiments are not limited thereto. For example, each pixel PX may include three or more TFTs and two or more capacitors in each pixel, and may further include additional wirings to have various structures. Herein, the term "pixel" refers to a smallest unit for displaying an image, and may be one of a red pixel emitting a red light, a green pixel emitting a green light, and a blue pixel emitting a blue light.

Referring to FIGS. 11 and 12, each pixel includes the switching TFT 10, the driving TFT 20, the capacitor 80, and the OLED 210. As used herein, a structure including the switching TFT 10, the driving TFT 20, and the capacitor 80 is referred to as a driving circuit unit 130.

The driving circuit unit 130 includes the gate line 151 disposed along one direction and the data line 171 and the common power line 172 insulated from and intersecting the gate line 151.

The substrate 110 may be a transparent insulating substrate 110 including a transparent material such as glass or plastic. For example, the substrate 110 may include at least one of kapton®, polyethersulphone (PES), polycarbonate (PC), polyimide (PI), polyethyleneterephthalate (PET), polyethylenenaphthalate (PEN), polyacrylate (PAR), and fiber reinforced plastic (FRP).

A buffer layer 120 may be disposed on the substrate 110. The buffer layer 120 may prevent infiltration of undesirable elements and planarize a surface, and may include suitable materials for planarizing and/or preventing infiltration. For example, the buffer layer 120 may include at least one of a silicon nitride ($SiN_x$) layer, a silicon oxide ($SiO_2$) layer, and a silicon oxynitride ($SiO_xN_y$) layer. However, the buffer layer 120 is not invariably necessary and may be omitted based on kinds of the substrate 110 and process conditions thereof.

A switching semiconductor layer 131 and a driving semiconductor layer 132 are disposed on the buffer layer 120.

The switching semiconductor layer 131 and the driving semiconductor layer 132 may include an oxide semiconductor, e.g., a polycrystalline silicon layer, an amorphous silicon layer, indium galuim zinc oxide (IGZO), and indium zinc tin oxide (IZTO). For example, in a case where the driving semiconductor layer 132 illustrated in FIG. 12 includes a polycrystalline silicon layer, the driving semiconductor layer 132 includes a channel area that is not doped with impurities and p+ doped source and drain areas that are formed on opposite sides of the channel area. In such an exemplary embodiment, p-type impurities, e.g., boron (B), may be used as dopant ions and $B_2H_6$ is typically used. Such impurities may vary depending on the kinds of TFTs.

An exemplary embodiment of the driving TFT 20 uses a PMOS (p-channel metal oxide semiconductor) TFT including p-type impurities, but exemplary embodiments are not limited thereto. Thus, the driving TFT 20 may also use an NMOS (n-channel metal oxide semiconductor) TFT or a CMOS (complementary metal oxide semiconductor) TFT.

A gate insulating layer 140 is disposed on the switching semiconductor layer 131 and the driving semiconductor layer 132. The gate insulating layer 140 may include at least one of, e.g., tetraethylorthosilicate (TEOS), silicon nitride ($SiN_x$), and silicon oxide ($SiO_2$). For example, the gate insulating layer 140 may have a double-layer structure where a $SiN_x$ layer having a thickness of 40 nm and a TEOX layer having a thickness of 80 nm are sequentially stacked.

A gate wiring which includes gate electrodes 152 and 155 is disposed on the gate insulating layer 140. The gate wiring further includes the gate line 151, a first capacitor plate 158, and other lines. In addition, the gate electrodes 152 and 155 are disposed to overlap a portion of or an entire portion of the semiconductor layers 131 and 132, in particular, the channel areas thereof. The gate electrodes 152 and 155 may prevent the channel area from being doped with impurities when source and drain areas 136 and 137 of the semiconductor layers 131 and 132 are doped with impurities during the process of forming the semiconductor layers 131 and 132.

The gate electrodes 152 and 155 and the first capacitor plate 158 are disposed on a same layer and include a substantially same metal material. The gate electrodes 152 and 155 and the first capacitor plate 158 may include at least one of, e.g., molybdenum (Mo), chromium (Cr), and tungsten (W).

An insulating interlayer 160 which covers the gate electrodes 152 and 155 is disposed on the gate insulating layer 140. The insulating interlayer 160, similar to the gate insulating layer 140, may include, e.g., silicon nitride ($SiN_x$), silicon oxide ($SiO_x$) or tetraethoxysilane (TEOS) but exemplary embodiments are not limited thereto.

A data wiring which includes source electrodes 173 and 176 and drain electrodes 174 and 177 is disposed on the insulating interlayer 160. The data wiring further includes the data line 171, the common power line 172, a second capacitor plate 178, and other wirings. In addition, the source electrodes 173 and 176 and the drain electrodes 174 and 177 are respectively connected to the source area 136 and the drain area 137 of the semiconductor layers 131 and 132 through a contact hole defined in the gate insulating layer 140 and the insulating interlayer 160.

As such, the switching TFT 10 includes the switching semiconductor layer 131, the switching gate electrode 152, the switching source electrode 173, and the switching drain electrode 174, and the driving TFT 20 includes the driving semiconductor layer 132, the driving gate electrode 155, the driving source electrode 176, and the driving drain electrode 177. Configurations of the TFTs 10 and 20 are not limited to the above embodiments, and thus may be modified into various structures that are known to and may be easily conceived by those skilled in the pertinent art.

The capacitor 80 includes the first capacitor plate 158 and the second capacitor plate 178, having the insulating interlayer 160 interposed therebetween.

The switching TFT 10 may function as a switching element configured to select pixels to perform light emission. The switching gate electrode 152 is connected to the gate line 151. The switching source electrode 173 is connected to the data line 171. The switching drain electrode 174 is spaced apart from the switching source electrode 173 and connected to the first capacitor plate 158.

The driving TFT 20 applies a driving power to a pixel electrode 211, which allows the light emitting layer 212 of the OLED 210 in the selected pixel to emit light. The driving gate electrode 155 is connected to the first capacitor plate 158. The driving source electrode 176 and the second capacitor plate 178 each are connected to the common power line 172. The driving drain electrode 177 is connected to the pixel electrode 211 of the OLED 210 through a contact hole.

With the aforementioned structure, the switching TFT 10 may be driven by a gate voltage applied to the gate line 151 and serve to transmit a data voltage applied to the data line 171 to the driving TFT 20. A voltage equivalent to a difference between a common voltage applied to the driving TFT 20 from the common power line 172 and the data voltage transmitted from the switching TFT 10 is stored in the capacitor 80, and a current corresponding to the voltage stored in the capacitor 80 flows to the OLED 210 through the driving TFT 20, such that the OLED 210 may emit light.

A planarization layer 165 covers the data wiring, such as the data line 171, the common power line 172, the source electrodes 173 and 176, the drain electrodes 174 and 177, the second capacitor plate 178, which is patterned using one mask. The planarization layer 165 is disposed on the insulating interlayer 160.

The planarization layer 165 substantially illuminates a step difference and planarizes a surface so as to increase luminance efficiency of the OLED 210 to be formed thereon. The planarization layer 165 may include at least one of, e.g., a polyacrylate resin, an epoxy resin, a phenolic resin, a polyamide resin, a polyimide resin, an unsaturated polyester resin, a polyphenylene ether resin, a polyphenylene sulfide resin, and benzocyclobutene (BCB).

The pixel electrode 211 of the OLED 210 is disposed on the planarization layer 165. The pixel electrode 211 is connected to the drain electrode 177 through the contact hole defined in the planarization layer 165.

A portion of or an entire portion of the pixel electrode 211 is disposed in a transmissive area (or light emitting area) of the pixel PX. That is, the pixel electrode 211 is disposed to correspond to the transmissive area of the pixel defined by a pixel defining layer 190. The pixel defining layer 190 may include a resin, e.g., polyacrylates resin and a polyimide resin.

The light emitting layer 212 is disposed on the pixel electrode 211 in the pixel area and a common electrode 213 is disposed on the pixel defining layer 190 and the light emitting layer 212.

The light emitting layer 212 includes a low-molecular weight organic material or a high-molecular weight organic material. At least one of a hole injection layer HIL and a hole transporting layer HTL may further be disposed between the pixel electrode 211 and the light emitting layer 212, and at least one of an electron transporting layer ETL and an electron injection layer EIL may further be disposed between the light emitting layer 212 and the common electrode 213.

The pixel electrode 211 and the common electrode 213 may be formed as one of the followings: a transmissive electrode, a transflective electrode, and a reflective electrode.

A transparent conductive oxide (TCO) may be used to form a transmissive electrode. Such a TCO may include at least one of indium tin oxide (ITO), indium zinc oxide (IZO), antimony tin oxide (ATO), aluminum zinc oxide (AZO), zinc oxide (ZnO), and alloys thereof.

A metal, e.g., magnesium (Mg), silver (Ag), gold (Au), calcium (Ca), lithium (Li), chromium (Cr), aluminum (Al), and copper (Cu), or an alloy thereof may be used to form a transflective electrode and a reflective electrode. In such an exemplary embodiment, whether an electrode is a transflective type or a reflective type depends on a thickness of the electrode. Typically, the transflective electrode has a thickness of about 200 nm or less and the reflective electrode has a thickness of about 300 nm or more. As the thickness of the transflective electrode decreases, light transmittance and resistance increases. On the contrary, as the thickness of the transflective electrode increases, light transmittance decreases.

In addition, the transflective electrode and the reflective electrode may have a multilayer structure which includes a metal layer including a metal or a metal alloy and a TCO layer stacked on the metal layer.

The pixel PX may have a both-side light emitting structure where light is emitted toward the pixel electrode 211 and the common electrode 213. In such an exemplary embodiment, both of the pixel electrode 211 and the common electrode 213 may be formed into a transmissive type or a transflective type.

The sealing member 250 is disposed on the common electrode 213. The sealing member 250 may use a transparent insulating substrate 110 including transparent materials such as glass or plastic. In addition, the sealing member 250 may have a thin film encapsulation structure in which one or more inorganic layers and one or more organic layers are alternately stacked.

The water-resistant coating layers 261*a* and 261*b* may use a polymer material having transparent properties. For example, the water-resistant coating layers 261*a* and 261*b* may use polyester and parylene. The water-resistant coating layers 261*a* and 261*b* may be coated in a thermal diffusion deposition method at room temperature or attached as a film shape. Further, the water-resistant coating layers 261*a* and 261*b* may use any water-resistant coating materials typically used by those skilled in the pertinent art.

The thermal-resistant coating layers 262*a* and 262*b* may use a material having transparent properties and high thermal conductivity. For example, the thermal-resistant coating layers 262*a* and 262*b* may use a graphite sheet and an acryl sheet. In addition, the thermal-resistant coating layers 262*a* and 262*b* may use any thermal-resistant coating materials typically used by those skilled in the pertinent art.

The crack prevention portion 400 and the alignment key 500 according to an exemplary embodiment may include at least one of a metal material and an inorganic material, which will be described with reference to FIGS. 13, 14, 15, 16, 17, 18, 19, and 20.

Figure 13:
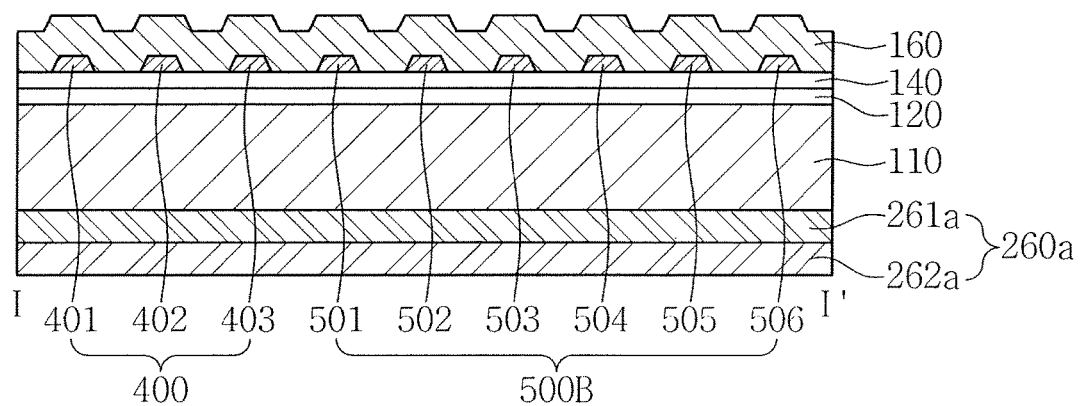
FIG. 13 illustrates a cross-sectional view along line I-I' of FIG. 4.

FIG. 13 is a cross-sectional view according to an exemplary embodiment taken along line I-I' of FIG. 4.

As illustrated in FIG. 13, the first, second, and third crack prevention patterns 401, 402, and 403 and the first, second, third, fourth, fifth and sixth alignment patterns 501, 502, 503. 504, 505, and 506 may be disposed on the gate insulating layer 140.

The first, second, and third crack prevention patterns 401, 402, and 403 and the first, second, third, fourth, fifth and sixth alignment patterns 501, 502, 503, 504, 505, and 506 may be disposed on a substantially same layer as a layer on which the gate electrode 152 is disposed.

The first, second, and third crack prevention patterns 401, 402, and 403 and the first, second, third, fourth, fifth and sixth alignment patterns 501, 502, 503, 504, 505, and 506 may include a substantially same material as a material included in the gate electrode 152 described above.

Figure 14:
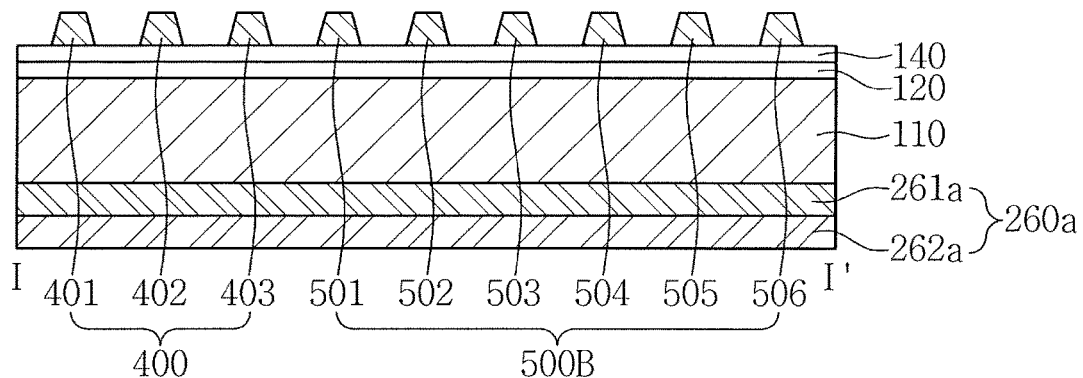
FIG. 14 illustrates a cross-sectional view of an alternative exemplary embodiment along line I-I' of FIG. 4.

FIG. 14 is a cross-sectional view according to an alternative exemplary embodiment taken along line I-I' of FIG. 4.

As illustrated in FIG. 14, the first, second, and third crack prevention patterns 401, 402, and 403 and the first, second, third, fourth, fifth and sixth alignment patterns 501, 502, 503, 504, 505, and 506 may be disposed on the gate insulating layer 140.

The first, second, and third crack prevention patterns 401, 402, and 403 and the first, second, third, fourth, fifth and sixth alignment patterns 501, 502, 503, 504, 505, and 506 may be disposed on a substantially same layer as a layer on which the insulating interlayer 160 is disposed.

The first, second, and third crack prevention patterns 401, 402, and 403 and the first, second, third, fourth, fifth and sixth alignment patterns 501, 502, 503, 504, 505, and 506 may include a substantially same material as a material included in the interlayer insulating layer 160 described above.

Figure 15:
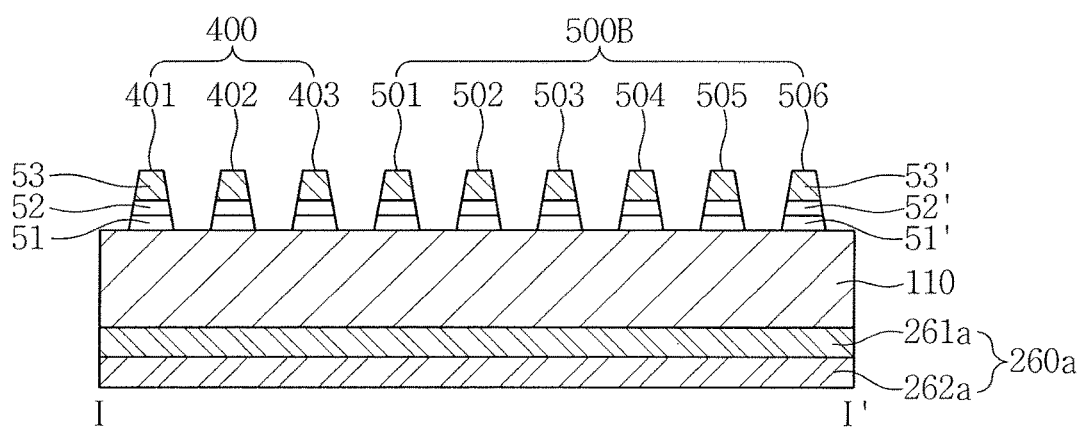
FIG. 15 illustrates a cross-sectional view of another alternative exemplary embodiment along line I-I' of FIG. 4.

FIG. 15 is a cross-sectional view according to another alternative exemplary embodiment taken along line of FIG. 4.

As illustrated in FIG. 15, the first, second, and third crack prevention patterns 401, 402, and 403 and the first, second, third, fourth, fifth and sixth alignment patterns 501, 502, 503, 504, 505, and 506 may be disposed on the substrate 110.

Each of the first, second, and third crack prevention patterns 401, 402, and 403 may include a plurality pattern layers 51, 52, and 53 that are vertically stacked. For example, the first crack prevention pattern 401 may include a first pattern layer 51 on the substrate 110, a second pattern layer 52 on the first pattern layer 51, and a third pattern layer 53 on the second pattern layer 52. For example, the first pattern layer 51 may be disposed between the substrate 110 and the second pattern layer 52, the second pattern layer 52 may be disposed between the first pattern layer 51 and the third pattern layer 53, and the third pattern layer 53 may be disposed between the second pattern layer 52 and the planarization layer 165. The first pattern layer 51, the second pattern layer 52, and the third pattern layer 53 may have a substantially same shape on a plane.

The first pattern layer 51 may be disposed on a substantially same layer as a layer on which the buffer layer 120 is disposed, the second pattern layer 52 may be disposed on a substantially same layer as a layer on which the gate insulating layer 140 is disposed, and the third pattern layer 53 may be disposed on a substantially same layer as a layer on which the insulating interlayer 160 is disposed.

The first pattern layer 51 may include a substantially same material as a material included in the buffer layer 120, the second pattern layer 52 may include a substantially same material as a material included in the gate insulating layer 140, and the third pattern layer 53 may include a substantially same material as a material included in the insulating interlayer 160.

Other second and third crack prevention patterns 402 and 403 may have a substantially same structure as that of the first crack prevention pattern 401 described above.

Each of the first, second, third, fourth, fifth and sixth alignment patterns 501, 502, 503, 504, 505, and 506 may include a plurality of pattern layers 51', 52', and 53' that are vertically stacked. For example, the first alignment pattern 501 may include a first pattern layer 51' on the substrate 110, a second pattern layer 52' on the first pattern layer 51', and a third pattern layer 53' on the second pattern layer 52'. For example, the first pattern layer 51' may be disposed between the substrate 110 and the second pattern layer 52', the second pattern layer 52' may be disposed between the first pattern layer 51' and the third pattern layer 53', and the third pattern layer 53' may be disposed between the second pattern layer 52' and the planarization layer 165. The first pattern layer 51', the second pattern layer 52' and the third pattern layer 53' may have a substantially same shape on a plane.

The first pattern layer 51' may be on a substantially same layer as a layer on which the buffer layer 120 is disposed, the second pattern layer 52' may be on a substantially same layer as a layer on which the gate insulating layer 140 is disposed, and the third pattern layer 53' may be disposed on a substantially same layer as a layer on which the insulating interlayer 160 is disposed.

The first pattern layer 51' includes a substantially same material as a material included in the buffer layer 120, the second pattern layer 52' includes a substantially same material as a material included in the gate insulating layer 140, and the third pattern layer 53' includes a substantially same material as a material included in the insulating interlayer 160.

Other second, third, fourth, fifth, and sixth alignment patterns 502, 503, 504, 505, and 506 may have a substantially same structure as that of the first alignment pattern 501 described above.

Figure 16:
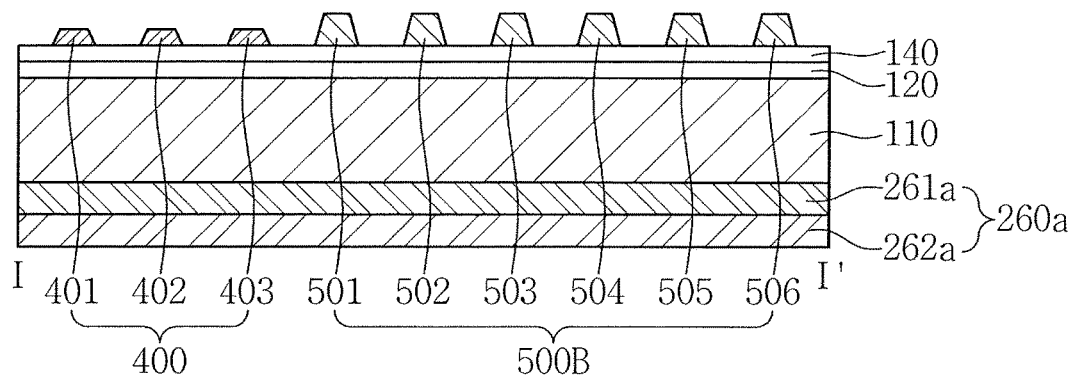
FIG. 16 illustrates a cross-sectional view of still another alternative exemplary embodiment along line I-I' of FIG. 4.

FIG. 16 is a cross-sectional view according to still another alternative exemplary embodiment taken along line I-I' of FIG. 4.

As illustrated in FIG. 16, the first, second, and third crack prevention patterns 401, 402, and 403 and the first, second, third, fourth, fifth and sixth alignment patterns 501, 502, 503, 504, 505, and 506 may be disposed on the gate insulating layer 140.

The first, second, and third crack prevention patterns 401, 402, and 403 may be disposed on a substantially same layer as a layer on which the gate electrode 152 is disposed. The first, second, and third crack prevention patterns 401, 402, and 403 may include a substantially same material as a material included in the gate electrode 152 described above.

The first, second, third, fourth, fifth and sixth alignment patterns 501, 502, 503, 504, 505, and 506 may be disposed on a substantially same layer as a layer on which the insulating interlayer 160 is disposed. The first, second, third, fourth, fifth and sixth alignment patterns 501, 502, 503, 504, 505, and 506 may include a substantially same material as a material included in the interlayer insulating layer 160 described above.

As such, the crack prevention pattern may include a material different from that included in the alignment pattern. In addition, the crack prevention pattern and the alignment pattern may have different thicknesses. For example, the first crack prevention pattern 401 has a less thickness than that of the first alignment pattern 501.

Figure 17:
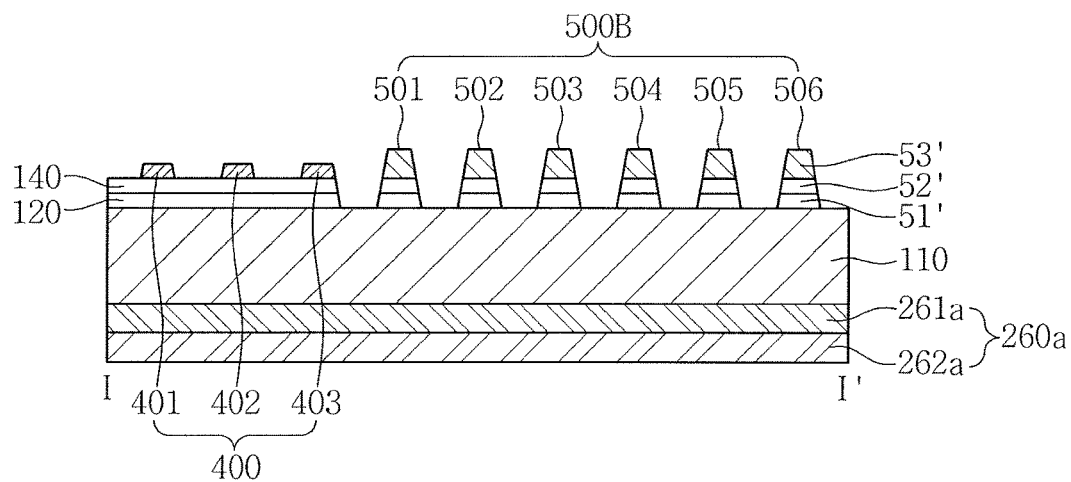
FIG. 17 illustrates a cross-sectional view of yet another alternative exemplary embodiment taken line I-I' of FIG. 4.

FIG. 17 is a cross-sectional view according to yet another alternative exemplary embodiment taken along line I-I' of FIG. 4.

As illustrated in FIG. 17, the first, second, and third crack prevention patterns 401, 402, and 403 may be disposed on the gate insulating layer 140.

The first, second, and third crack prevention patterns 401, 402, and 403 may be disposed on a substantially same layer as a layer on which the gate electrode 152 is disposed. The first, second, and third crack prevention patterns 401, 402, and 403 may include a substantially same material as a material included in the gate electrode 152.

The first, second, third, fourth, fifth and sixth alignment patterns 501, 502, 503, 504, 505, and 506 are disposed on the substrate 110. Each of the first, second, third, fourth, fifth and sixth alignment patterns 501, 502, 503, 504, 505, and 506 may include a plurality of pattern layers 51', 52', and 53' that are vertically stacked. For example, the first alignment pattern 501 may include a first pattern layer 51' on the substrate 110, a second pattern layer 52' on the first pattern layer 51', and a third pattern layer 53' on the second pattern layer 52'. For example, the first pattern layer 51' may be disposed between the substrate 110 and the second pattern layer 52', the second pattern layer 52' may be disposed between the first pattern layer 51' and the third pattern layer 53', and the third pattern layer 53' may be disposed between the second pattern layer 52' and the planarization layer 165.

The first pattern layer 51' may be disposed on a substantially same layer as a layer on which the buffer layer 120 is disposed, the second pattern layer 52' may be disposed on a substantially same layer as a layer on which the gate insulating layer 140 is disposed, and the third pattern layer 53' may be disposed on a substantially same layer as a layer on which the insulating interlayer 160 is disposed.

The first pattern layer 51' includes a substantially same material as a material included in the buffer layer 120, the second pattern layer 52' includes a substantially same material as a material included in the gate insulating layer 140, and the third pattern layer 53' includes a substantially same material as a material included in the insulating interlayer 160.

The first pattern layer 51', the second pattern layer 52', and the third pattern layer 53' may have a substantially same shape on a plane.

Other second, third, fourth, fifth, and sixth alignment patterns 502, 503, 504, 505, and 506 may have a substantially same structure as that of the first alignment pattern 501.

As such, the crack prevention pattern may include a different material from a material included in the alignment pattern. In addition, the crack prevention pattern and the alignment pattern may have different thicknesses. For example, the first alignment pattern 501 has a greater thickness than that of the first crack prevention pattern 401.

Figure 18:
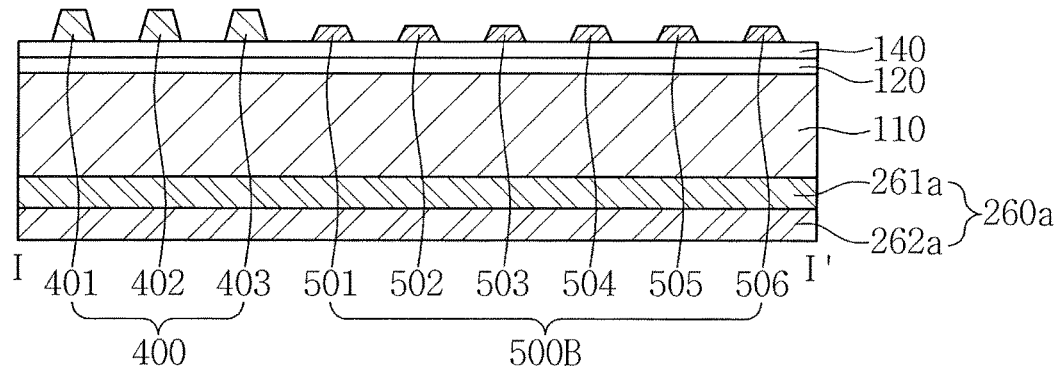
FIG. 18 illustrates a cross-sectional view of still yet another alternative exemplary embodiment along line I-I' of FIG. 4.

FIG. 18 is a cross-sectional view according to still yet another alternative exemplary embodiment taken along line I-I' of FIG. 4;

As illustrated in FIG. 18, the first, second, and third crack prevention patterns 401, 402, and 403 and the first, second, third, fourth, fifth and sixth alignment patterns 501, 502, 503, 504, 505, and 506 may be disposed on the gate insulating layer 140.

The first, second, and third crack prevention patterns 401, 402, and 403 may be disposed on a substantially same layer as a layer on which the insulating interlayer 160 is disposed.

The first, second, and third crack prevention patterns 401, 402, and 403 may include a substantially same material as a material included in the insulating interlayer 160 described above.

The first, second, third, fourth, fifth and sixth alignment patterns 501, 502, 503, 504, 505, and 506 may be disposed on a substantially same layer as a layer on which the gate electrode 152 is disposed. The first, second, third, fourth, fifth and sixth alignment patterns 501, 502, 503, 504, 505, and 506 may include a substantially same material as a material included in the gate electrode 152 described above.

As such, the crack prevention pattern may include a material different from that included in the alignment pattern. In addition, the crack prevention pattern and the alignment pattern may have different thicknesses. For example, the first crack prevention pattern 401 has a greater thickness than that of the first alignment pattern 501.

Figure 19:
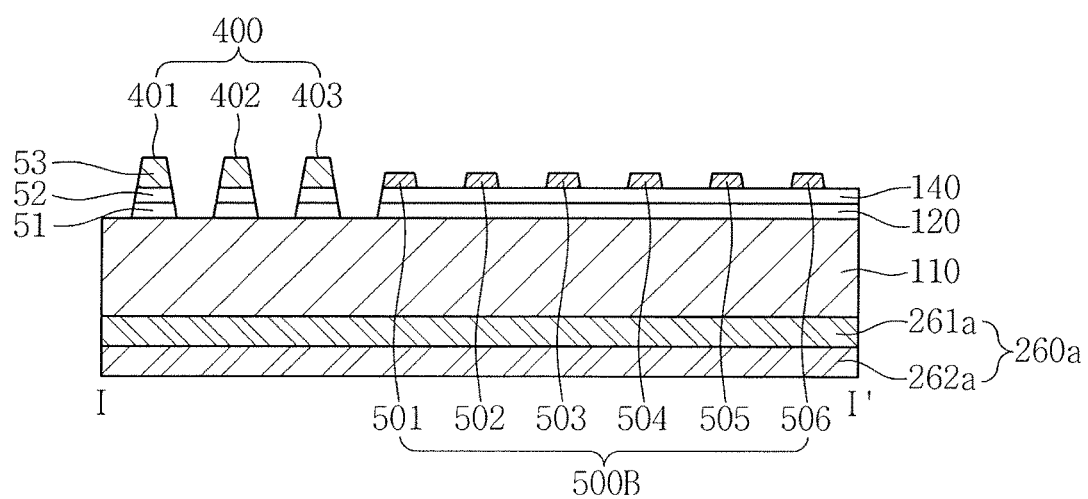
FIG. 19 illustrates a cross-sectional view of still yet another alternative exemplary embodiment along line I-I' of FIG. 4.

FIG. 19 is a cross-sectional view according to still yet another alternative exemplary embodiment taken along line I-I' of FIG. 4.

As illustrated in FIG. 19, each of the first, second, and third crack prevention patterns 401, 402, and 403 may include a plurality of pattern layers 51, 52, and 53 that are vertically stacked. For example, the first crack prevention pattern 401 may include a first pattern layer 51 on the substrate 110, a second pattern layer 52 on the first pattern layer 51, and a third pattern layer 53 on the second pattern layer 52. For example, the first pattern layer 51 may be disposed between the substrate 110 and the second pattern layer 52, the second pattern layer 52 may be disposed between the first pattern layer 51 and the third pattern layer 53, and the third pattern layer 53 may be disposed between the second pattern layer 52 and the planarization layer 165.

The first pattern layer 51 may be disposed on a substantially same layer as a layer on which the buffer layer 120 is disposed, the second pattern layer 52 may be disposed on a substantially same layer as a layer on which the gate insulating layer 140 is disposed, and the third pattern layer 53 may be disposed on a substantially same layer as a layer on which the insulating interlayer 160 is disposed.

The first pattern layer 51 may include a substantially same material as a material included in the buffer layer 120, the second pattern layer 52 may include a substantially same material as a material included in the gate insulating layer 140, and the third pattern layer 53 may include a substantially same material as a material included in the insulating interlayer 160.

The first pattern layer 51, the second pattern layer 52, and the third pattern layer 53 may have a substantially same shape on a plane.

Other second and third crack prevention patterns 402 and 403 may have a substantially same structure as that of the first crack prevention pattern 401.

The first, second, third, fourth, fifth and sixth alignment patterns 501, 502, 503, 504, 505, and 506 may be disposed on the gate insulating layer 140. The first, second, third, fourth, fifth and sixth alignment patterns 501, 502, 503, 504, 505, and 506 may be disposed on a substantially same layer as a layer on which the gate electrode 152 described above is disposed. The first, second, third, fourth, fifth and sixth alignment patterns 501, 502, 503, 504, 505, and 506 may include a substantially same material as a material included in the gate electrode 152 described above.

As such, the crack prevention pattern may include a different material from a material included in the alignment pattern. In addition, the crack prevention pattern and the alignment pattern may have different thicknesses. For example, the first crack prevention pattern 401 has a greater thickness than that of the first alignment pattern 501.

Figure 20:
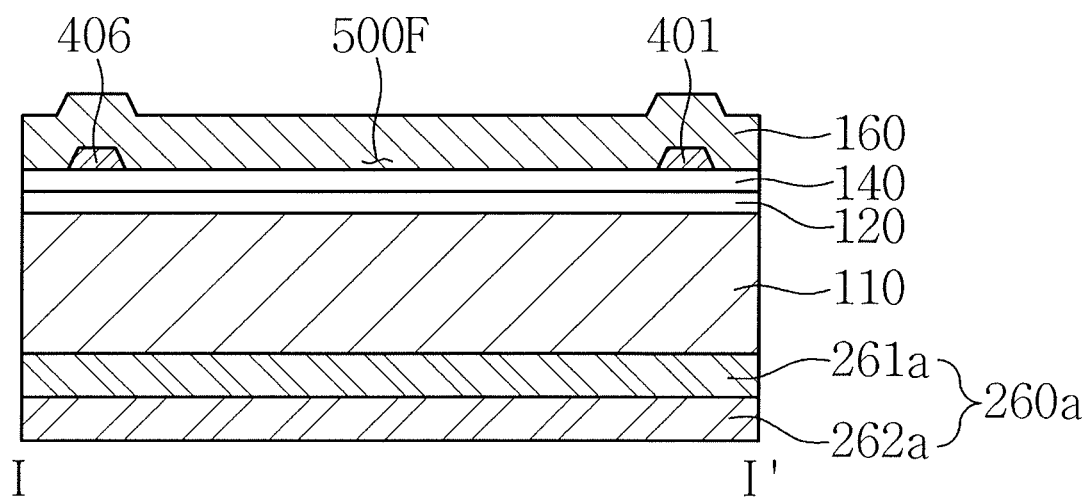
FIG. 20 illustrates a cross-sectional view along line 14 of FIG. 8.

FIG. 20 is a cross-sectional view taken along line I-I' of FIG. 8.

As illustrated in FIG. 20, the first crack prevention pattern 401 and the sixth crack prevention pattern 406 are disposed on the gate insulating layer 140. Although not illustrated, the second, third, fourth and fifth crack prevention patterns 402, 403, 404 and 405 are also disposed on the gate insulating layer 140.

The first crack prevention pattern 401 and the sixth crack prevention pattern 406 are disposed on a substantially same layer as a layer on which the gate electrode 152 described above is disposed. Although not illustrated, the second, third, fourth and fifth crack prevention patterns 402, 403, 404 and 405 are also disposed on the gate insulating layer 140.

The sixth alignment key 500F is disposed between the first crack prevention pattern 401 and the sixth crack prevention pattern 406.

Figure 21:
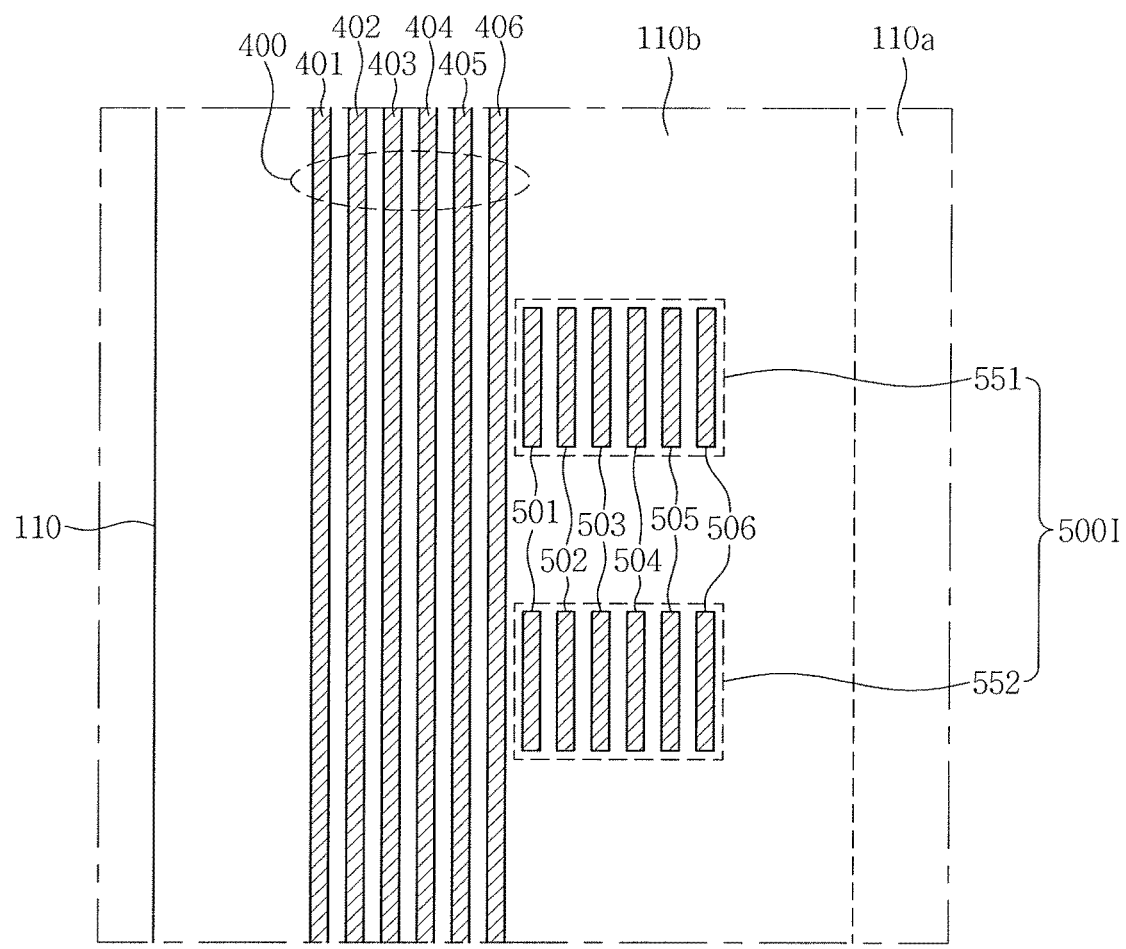
FIG. 21 illustrates a view of an alternative shape of the alignment key according to an exemplary embodiment.

FIG. 21 is a view illustrating an alternative shape of the alignment key according to an exemplary embodiment.

As illustrated in FIG. 21, an alignment key 500I may include a first alignment pattern portion 551 and a second alignment pattern portion 552 spaced apart from each other.

The first alignment pattern portion 551 includes first, second, third, fourth, fifth and sixth alignment patterns 501, 502, 503, 504, 505, and 506. The descriptions of the first, second, third, fourth, fifth and sixth alignment patterns 501, 502, 503, 504, 505, and 506 of the first alignment pattern portion 551 will make reference to FIG. 3 and the related description.

The second alignment pattern portion 552 includes first, second, third, fourth, fifth, and sixth alignment patterns 501, 502, 503, 504, 505, and 506. The descriptions of the first, second, third, fourth, fifth and sixth alignment patterns 501, 502, 503, 504, 505, and 506 of the second alignment pattern portion 552 will make reference to FIG. 3 and the related description.

Although not illustrated, the number of alignment patterns included in the first alignment pattern portion 551 may be different from the number of alignment patterns included in the second alignment pattern portion 552. For example, the number of alignment patterns included in the first alignment pattern portion 551 may be greater than the number of alignment patterns included in the second alignment pattern portion 552.

Although not illustrated, each of the second alignment key 500B, the third alignment key 500C, the fourth alignment key 500D, the fifth alignment key 500E, the sixth alignment key 500F, the seventh alignment key 500G and the eighth alignment key 500H described above may have a substantially same shape as a shape of the alignment key 500I of FIG. 21.

Figure 22:
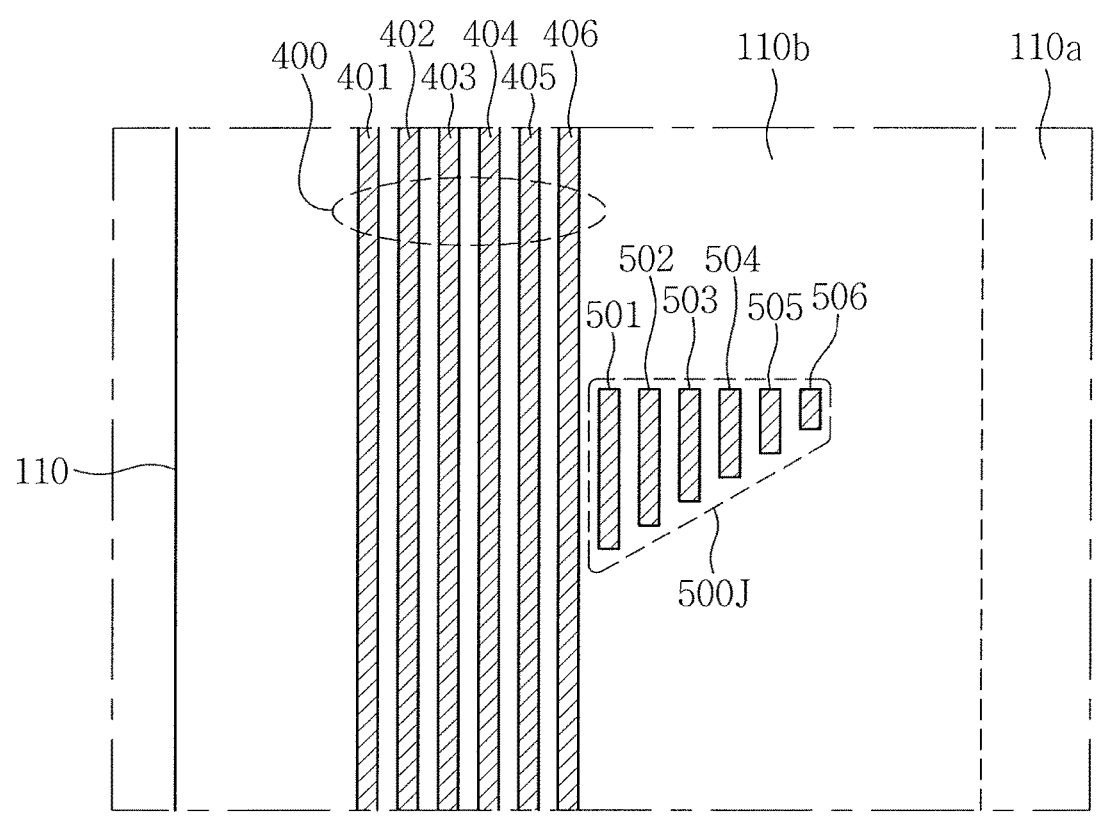
FIG. 22 illustrates a view of another alternative shape of the alignment key according to an exemplary embodiment.

FIG. 22 is a view illustrating another alternative shape of the alignment key according to an exemplary embodiment.

As illustrated in FIG. 22, an alignment key 500J may include a plurality of alignment patterns 501, 502, 503, 504, 505, and 506 spaced apart from each other. In such an exemplary embodiment, the alignment patterns 501, 502, 503, 504, 505, and 506 may have a less area, as more adjacent to the display area 110a. For example, the alignment key 500J may have a triangular shape as a whole, as illustrated in FIG. 19.

Although not illustrated, each of the second alignment key 500B, the third alignment key 500C, the fourth alignment key 500D, the fifth alignment key 500E, the sixth alignment key 500F, the seventh alignment key 500G and the eighth alignment key 500H described above may have a substantially same shape as a shape of the alignment key 500J of FIG. 22.

Figure 23:
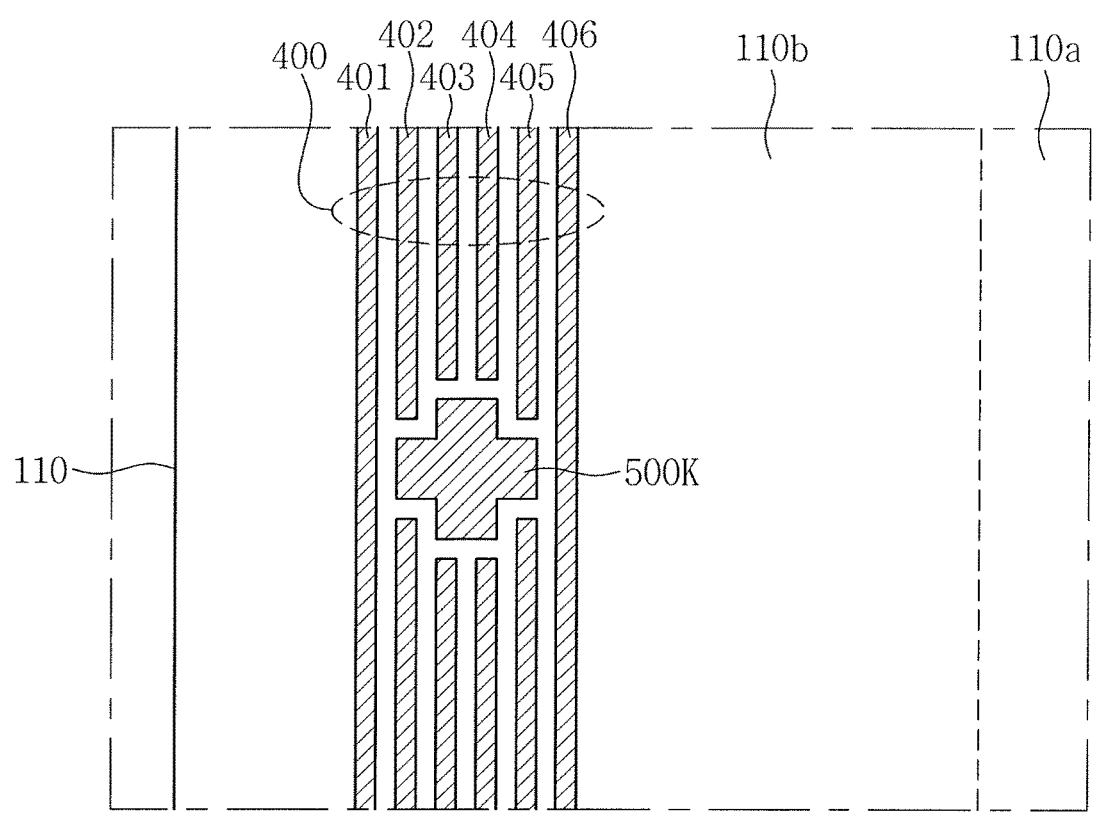
FIG. 23 illustrates a view of still another alternative shape of the alignment key according to an exemplary embodiment.

FIG. 23 is a view illustrating still another alternative shape of the alignment key according to an exemplary embodiment.

As illustrated in FIG. 23, an alignment key 500K may have a cross shape. This alignment key 500K is disposed between the first crack prevention pattern 401 and the sixth crack prevention pattern 406 facing the first crack prevention pattern 401. In addition, the alignment key 500K is disposed between facing end portions of respective ones of the second, third, fourth and fifth crack prevention patterns 402, 403, 404 and 405 between the first crack prevention pattern 401 and the sixth crack prevention pattern 406.

Although not illustrated, each of the second alignment key 500B, the third alignment key 500C, the fourth alignment key 500D, the fifth alignment key 500E, the sixth alignment key 500F, the seventh alignment key 500G and the eighth alignment key 500H described above may have a substantially same shape as a shape of the alignment key 500K of FIG. 23.

Figure 24:
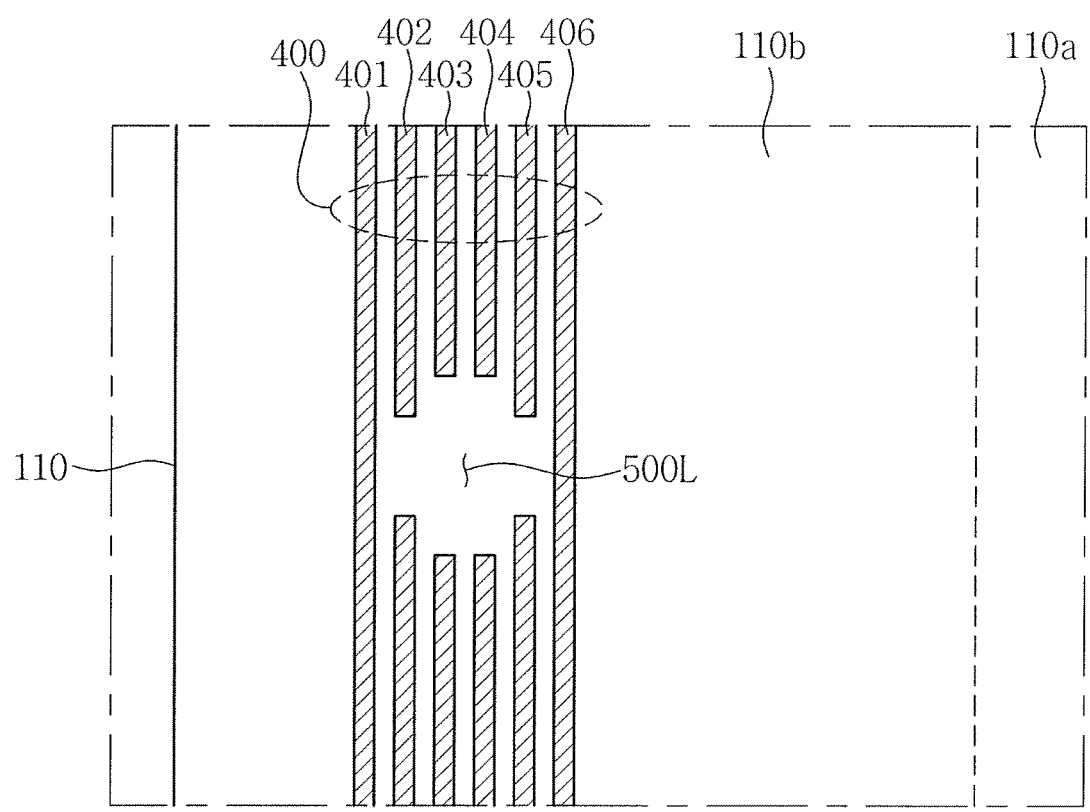
FIG. 24 illustrates a view of yet another alternative shape of the alignment key according to an exemplary embodiment.

FIG. 24 is a view illustrating yet another alternative shape of the alignment key according to an exemplary embodiment.

As illustrated in FIG. 24, an alignment key 500L is a groove defined by first, second, third, fourth, fifth and sixth crack prevention patterns 401, 402, 403, 404, 405 and 406. That is, the alignment key 500L is depressed in shape. The alignment key 500L is a cross-shaped groove.

Figure 25:
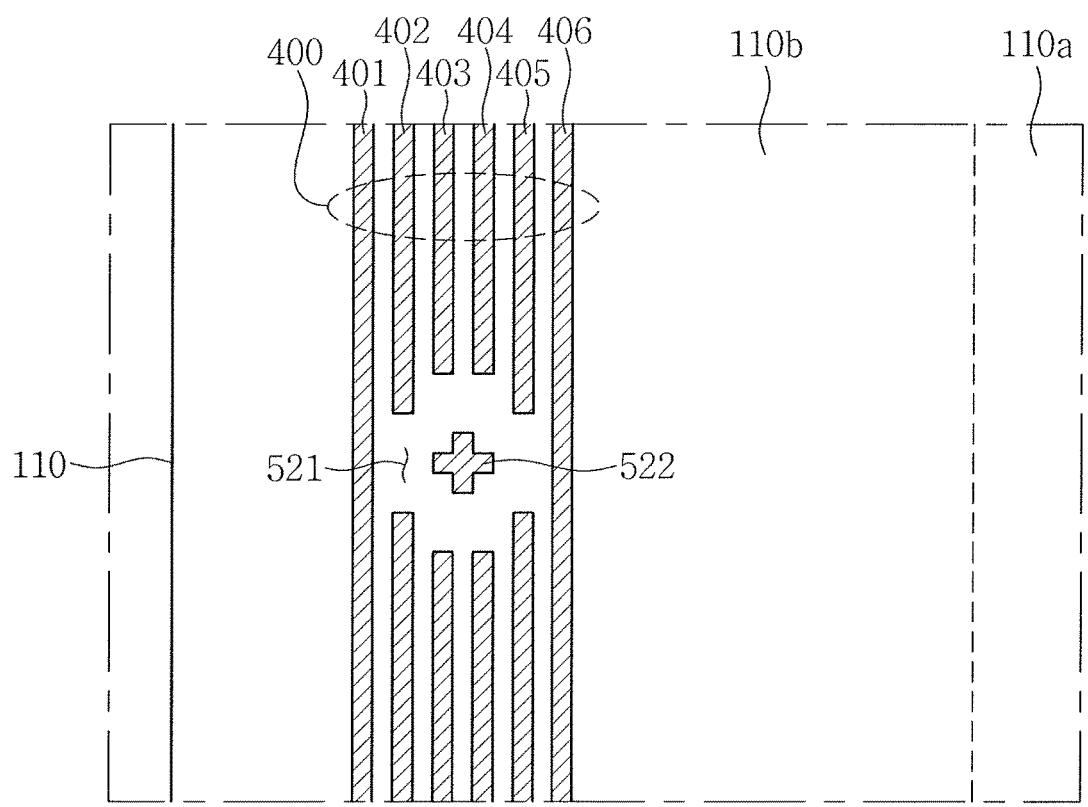
FIG. 25 illustrates a view of still yet another alternative shape of the alignment key according to an exemplary embodiment.

FIG. 25 is a view illustrating still yet another alternative shape of the alignment key according to an exemplary embodiment.

As illustrated in FIG. 25, the alignment key 500M includes a first alignment key 521 having a recessed shape and a second alignment key at the center of the first alignment key 521.

The first alignment key 521 is a depressed groove like the aforementioned alignment key 500L of FIG. 24. The first alignment key 521 may have a cross shape.

The second alignment key 522 may have a cross shape as the shape of the alignment key 500K of FIG. 23. However, the second alignment key 522 has a smaller shape than that of the alignment key 500K of FIG. 23.

The second alignment key 522 is disposed between the first crack prevention pattern 401 and the sixth crack prevention pattern 406. In addition, a portion of the second alignment key 522 is disposed between facing end portions of respective ones of several crack prevention patterns, e.g., the third and fourth crack prevention patterns 403 and 404 among the plurality of crack prevention patterns, e.g., the second, third, fourth and fifth crack prevention patterns 402, 403, 404 and 405, between the first crack prevention pattern 401 and the sixth crack prevention pattern 406.

Figure 26:
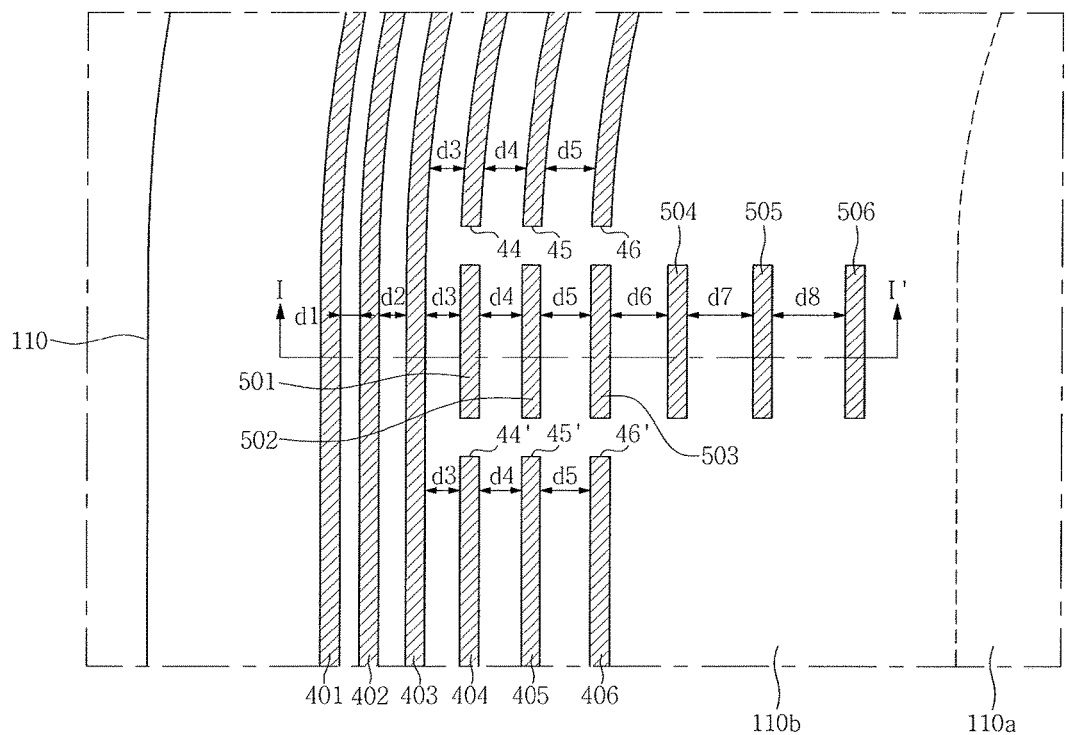
FIG. 26 illustrates a plan view of a crack prevention pattern and an alignment key according to an alternative exemplary embodiment.
Figure 27:
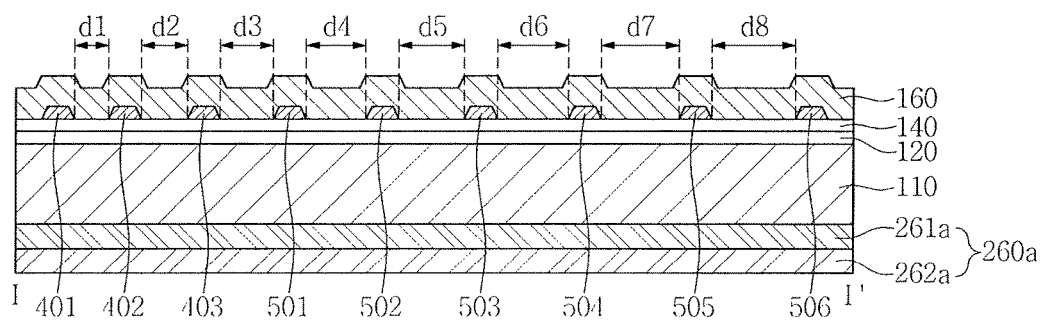
FIG. 27 illustrates a cross-sectional view along line I-I' of FIG. 26.

FIG. 26 is a plan view illustrating a crack prevention pattern and an alignment key according to an alternative exemplary embodiment, and FIG. 27 is a cross-sectional view according to an exemplary embodiment taken along line I-I' of FIG. 26.

As illustrated in FIGS. 26 and 27, two adjacent ones of the plurality of crack prevention patterns 401, 402, 403, 404, 405 and 406 may have a gradually increasing distance, as more adjacent to the display area 110a. For example, distances among adjacent ones of the first, second, third, fourth, fifth and sixth crack prevention patterns 401, 402, 403, 404, 405 and 406 have a magnitude relation represented by the following Formula 1.

$$d1<d2<d3<d4<d5 \qquad \text{<Formula 1>}$$

In the Formula 1 above, "d1" represents the distance between the first crack prevention pattern 401 and the second crack prevention pattern 402, "d2" represents the distance between the second crack prevention pattern 402 and the third crack prevention pattern 403, "d3" represents the distance between the third crack prevention pattern 403 and the fourth crack prevention pattern 404, "d4" represents the distance between the fourth crack prevention pattern 404 and the fifth crack prevention pattern 405, and "d5" represents the distance between the fifth crack prevention pattern 405 and the sixth crack prevention pattern 406.

In an exemplary embodiment, although not illustrated, two adjacent ones of the plurality of crack prevention patterns 401, 402, 403, 404, 405 and 406 may have a gradually decreasing distance, as more adjacent to the display area 110a.

As illustrated in FIGS. 26 and 27, two adjacent ones of the plurality of alignment patterns 501, 502, 503, 504, 505, and 506 may have a gradually increasing distance, as more adjacent to the display area 110a. For example, distances among adjacent ones of the first, second, third, fourth, fifth and sixth alignment patterns 501, 502, 503, 504, 505, and 506 have a magnitude relation represented by the following Formula 2.

$$d4<d5<d6<d7<d8 \qquad \text{<Formula 2>}$$

In the above Formula 2, "d4" represents the distance between the first alignment pattern 501 and the second alignment pattern 502, "d5" represents the distance between the second alignment pattern 502 and the third alignment pattern 503, "d6" represents the distance between the third alignment pattern 503 and the fourth alignment pattern 504, "d7" represents the distance between the fourth alignment pattern 504 and the fifth alignment pattern 505, and "d8" represents the distance between the fifth alignment pattern 505 and the sixth alignment pattern 506.

In an exemplary embodiment, although not illustrated, two adjacent ones of the plurality of alignment patterns 501, 502, 503, 504, 505, and 506 may have a gradually decreasing distance, as more adjacent to the display area 110a.

Figure 28:
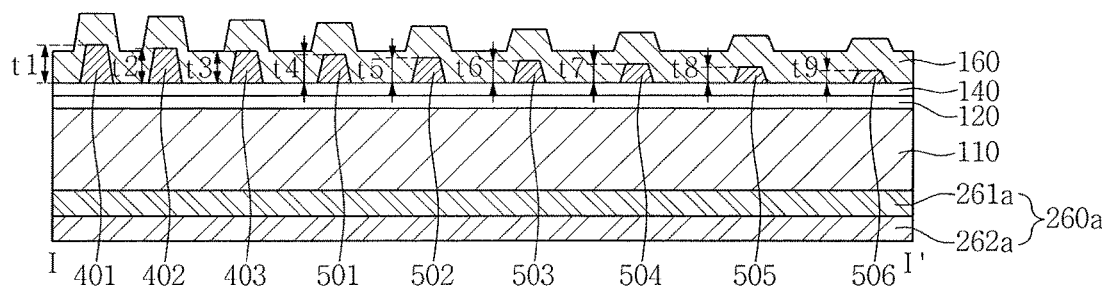
FIG. 28 illustrates a cross-sectional view according to an alternative exemplary embodiment along line I-I' of FIG. 26.

FIG. 28 is a cross-sectional view according to an alternative exemplary embodiment taken along line I-I' of FIG. 26.

As illustrated in FIG. 28, the plurality of crack prevention patterns 401, 402, 403, 404, 405 and 406 may have a gradually decreasing thickness, as more adjacent to the display area 110a. For example, respective thicknesses of the first, second, third, fourth, fifth and sixth crack prevention patterns 401, 402, 403, 404, 405 and 406 have a magnitude relation represented by the following Formula 3.

$$t1>t2>t3>t4>t5>t6 \qquad \text{<Formula 3>}$$

In the above Formula 3, "t1" represents the thickness of the first crack prevention pattern 401, "t2" represents the thickness of the second crack prevention pattern 402, "t3" represents the thickness of the third crack prevention pattern 403, "t4" represents the thickness of the fourth crack prevention pattern 404, "t5" represents the thickness of the fifth crack prevention pattern 405, and "t6" represents the thickness of the sixth crack prevention pattern 406.

In an exemplary embodiment, although not illustrated, the plurality of crack prevention patterns 401, 402, 403, 404, 405 and 406 may have a gradually increasing thickness, as more adjacent to the display area 110a.

As illustrated in FIG. 28, the plurality of alignment patterns 501, 502, 503, 504, 505, and 506 may have a gradually decreasing thickness, as more adjacent to the display area 110a. For example, respective thicknesses of the first, second, third, fourth, fifth and sixth alignment patterns 501, 502, 503, 504, 505, and 506 have a magnitude relation represented by the following Formula 4.

$$t4>t5>t6>t7>t8>t9 \qquad \text{<Formula 4>}$$

In the above Formula 4, "t4" represents the thickness of the first alignment pattern 501, "t5" represents the thickness of the second alignment pattern 502, "t6" represents the thickness of the third alignment pattern 503, "t7" represents the thickness of the fourth alignment pattern 504. "t8" represents the thickness of the fifth alignment pattern 505, and "t9" represents the thickness of the sixth alignment pattern 506.

In an exemplary embodiment, although not illustrated, the plurality of alignment patterns 501, 502, 503, 504, 505, and 506 may have a gradually increasing thickness, as more adjacent to the display area 110a.

As set forth above, in one or more exemplary embodiments, the display device may provide the following effects. At least a portion of the alignment key is disposed between facing end portions of the crack prevention pattern. That is, as at least a portion of the alignment key is disposed in a same region as the crack prevention pattern, i.e., the facing end portions of the crack prevention pattern are spaced apart from each other to define a space for the alignment key therebetween, a separate space for the alignment key, e.g., for the portion of the alignment key positioned within the crack prevention pattern, is not required. Accordingly, the area occupied by the alignment key may be reduced in the non-display area. As a result, the non-display area may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A display device, comprising:
   a substrate having a display area and a non-display area surrounding the display area;
   a driving unit connected to the substrate;
   at least one first crack prevention pattern at the non-display area, the at least one first crack prevention pattern including facing end portions; and
   an alignment key at the non-display area;
   wherein at least a portion of the alignment key is between the facing end portions of the at least one first crack prevention pattern.
2. The display device as claimed in claim 1, further comprising at least one second crack prevention pattern at the non-display area, the at least one second crack preven- tion pattern being positioned farther away from the display area than the at least one first crack prevention pattern is from the display area.

3. The display device as claimed in claim 2, wherein the alignment key is between the at least one second crack prevention pattern and the display area.

4. The display device as claimed in claim 2, wherein the at least one second crack prevention pattern encloses sides of the display area except a side facing the driving unit.

5. The display device as claimed in claim 2, wherein the at least one second crack prevention pattern encloses the display area.

6. The display device as claimed in claim 2, further comprising at least one third crack prevention pattern at the non-display area, the at least one third crack prevention pattern being positioned more adjacent to the display area than the at least one first crack prevention pattern is to the display area.

7. The display device as claimed in claim 6, wherein the alignment key is between the at least one second crack prevention pattern and the at least one third crack prevention pattern.

8. The display device as claimed in claim 6, wherein two adjacent ones of a plurality of crack prevention patterns including the at least one first crack prevention pattern, the at least one second crack prevention pattern, and the at least one third crack prevention pattern have a gradually increasing distance or a gradually decreasing distance therebetween, as they are more adjacent to the display area.

9. The display device as claimed in claim 6, wherein a plurality of crack prevention patterns including the at least one first crack prevention pattern, the at least one second crack prevention pattern, and the at least one third crack prevention pattern have a gradually decreasing thickness or a gradually increasing thickness, as they are more adjacent to the display area.

10. The display device as claimed in claim 1, wherein the alignment key includes a plurality of alignment patterns, at least one alignment pattern of the plurality of alignment patterns being between the facing end portions of the at least one first crack prevention pattern.

11. The display device as claimed in claim 10, wherein a distance between adjacent ones of the alignment patterns is substantially the same as or different from a distance between adjacent ones of the first crack prevention patterns.

12. The display device as claimed in claim 10, wherein two adjacent ones of the alignment patterns have a gradually increasing distance or a gradually decreasing distance therebetween, as they are more adjacent to the display area.

13. The display device as claimed in claim 10, wherein the plurality of alignment patterns have a gradually increasing thickness or a gradually decreasing thickness, as they are more adjacent to the display area.

14. The display device as claimed in claim 1, wherein the first crack prevention pattern includes a substantially same material or a different material from a material forming the alignment key.

15. The display device as claimed in claim 14, wherein at least one of the first crack prevention pattern and the alignment key includes a metal material or an inorganic material.

16. A display device, comprising:
  a substrate having a display area and a non-display area surrounding the display area;
  a driving unit connected to the substrate;
  at least one first crack prevention pattern at the non-display area;
  at least one second crack prevention pattern at the non-display area, the at least one second crack prevention pattern being farther away from the display area than the at least one first crack prevention pattern is from the display area; and
  at least one third crack prevention pattern at the non-display area, the at least one third crack prevention pattern being more adjacent to the display area than the at least one first crack prevention pattern is to the display area,
  wherein the at least one first crack prevention pattern includes facing end portions, the facing end portions being between the second crack prevention pattern and the third crack prevention pattern.

17. The display device as claimed in claim 16, further comprising an alignment key between the at least one second crack prevention pattern and the at least one third crack prevention pattern.

18. The display device as claimed in claim 17, wherein at least a portion of the alignment key is between facing end portions of at least one of the at least one first crack prevention pattern.

19. The display device as claimed in claim 18, wherein the alignment key is not disposed between facing end portions of at least another of the at least one first crack prevention pattern.

20. The display device as claimed in claim 16, wherein a distance between facing end portions of at least one of the at least one first crack prevention pattern is substantially the same as or different from a distance between facing end portions of at least another of the at least one first crack prevention pattern.

* * * * *